United States Patent [19]
Ogawa et al.

[11] Patent Number: 6,044,792
[45] Date of Patent: Apr. 4, 2000

[54] PLASMA CVD APPARATUS

[75] Inventors: Yoichi Ogawa; Tetsuo Mizumura; Akira Yano, all of Ibaraki-ken; Hideo Kusada, Kyoto; Takashi Kubota, Tsukuba; Michio Asano; Kunio Wakai, both of Ibaraki-ken, all of Japan

[73] Assignee: Hitachi Maxwell, Ltd., Osaka, Japan

[21] Appl. No.: 08/926,454

[22] Filed: Sep. 10, 1997

[30] Foreign Application Priority Data

Sep. 10, 1996 [JP] Japan ................................. 8-239517

[51] Int. Cl.⁷ .................................................. C23C 16/00
[52] U.S. Cl. ...................... 118/723 E; 118/718; 118/730
[58] Field of Search ............................ 118/718, 723 E, 118/730

[56] References Cited

U.S. PATENT DOCUMENTS

| | | | |
|---|---|---|---|
| 5,224,441 | 7/1993 | Felts et al. ................................. | 118/718 |
| 5,258,074 | 11/1993 | Okuda et al. ............................ | 118/718 |
| 5,437,725 | 8/1995 | Schuster et al. ......................... | 118/718 |
| 5,464,667 | 11/1995 | Köhler et al. ............................ | 427/577 |
| 5,743,966 | 4/1998 | Woolley et al. ......................... | 118/718 |

FOREIGN PATENT DOCUMENTS

A8-41645 2/1996 Japan.
A8-49076 2/1996 Japan.

*Primary Examiner*—Bruce Breneman
*Assistant Examiner*—Luz Alejandro

[57] ABSTRACT

A continuous plasma CVD apparatus, characterized in that frequency of high-frequency bias is in the range of 50–900 KHz, a blocking condenser is provided between a thin film and a high-frequency source so that the product C·f of electrostatic capacity C of the blocking condenser and frequency f of the high-frequency source is 0.02 [F·Hz] or more, and the total of impedances of all the rollers provided in the route of from a substrate unwind roller to a rotating drum is 10 kΩ or more and the total of impedances of all the rollers provided in the route of from the rotating drum to a wind roller is 10 kΩ or more. According to this apparatus, it becomes possible to continuously form a film without causing damage and deterioration of the substrate.

7 Claims, 18 Drawing Sheets

PLASMA CVD APPARATUS

BACKGROUND OF THE INVENTION

The present invention relates to a plasma CVD apparatus which are used for preparation of, for example, magnetic recording media and other functional thin films, and more particularly to a continuous plasma CVD apparatus and a continuous plasma CVD method which are suitable for forming, at high speed, a broad and uniform CVD thin film of high quality and free from defects.

In the wide variety of the fields of thin film magnetic recording media and various functional media produced using insulation films such as of polyethylene, polypropylene, polyethylene terephthalate, polyethylene naphthalate, polyaramid and polyimide, it is attempted to further provide on these continuous substrates a plasma CVD film such as a protective film, lubricating film or moistureproof film.

When CVD film formation is carried out on such continuous flexible substrates, mass-production becomes possible and sharp reduction of cost can be expected, and for further improvement in productivity, technique of broad film formation at high speed is important.

The most important requirement for the increase of film forming speed is to produce molecular species such as active ions and radical molecules at a high density by supplying a large quantity of energy to plasma and to effectively introduce them into the substrate. Furthermore, in order to obtain films of high quality, a necessary kinetic energy must be given to the ions introduced into the substrate and for this purpose, a bias voltage is applied to the plasma exciting portion and/or substrate side to perform acceleration of ions. On the other hand, when a large quantity of energy is applied to plasma in this way, energy of the plasma naturally migrates to the substrate to heat the substrate. If the substrate is heated, the film forming speed considerably decreases, causing deterioration of film quality and distortion and breakage of the substrate.

In the case of the substrates having electrical conductivity such as those of thin film magnetic recording media and various functional films, furthermore, ionic current flows through the conductive film whereby the substrates are subjected to further heating due to Joule's heat. It is well known that especially when ion introduction amount is increased for increasing film forming speed and, moreover, ion acceleration voltage is increased for the improvement of film quality, the substrates are considerably damaged.

Furthermore, for increasing the productivity, broadening of the width of substrate is necessary together with increase in film forming speed. An important requirement which governs the width of film is uniformity of plasma density and ion acceleration bias voltage. If the plasma density and the bias voltage are ununiform, film thickness and film quality greatly vary in the width direction.

High-speed formation of broad plasma CVD films is very difficult as mentioned above, and especially when a substrate which has electrical conductivity in at least a part thereof and generates Joule's heat upon passing a current is used, the high-speed formation of broad plasma CVD films becomes more difficult and a breakthrough is required.

Many factors for occurrence of heating of substrate are considered, but main factors are heat generation caused by the striking energy of accelerated ions introduced into the substrate and heat generation caused by Joule's heat of ionic current. Among them, the heat generation caused by the striking energy cannot be avoided because the striking energy is necessary for obtaining a film of high quality. On the other hand, the Joule's heat due to ionic current is unnecessary and depends on the method of bias application for acceleration of ions. How to inhibit the heating by ionic current is the most important point for realization of a stable high-speed process.

Next, results of comparative investigation of conventional examples will be explained. FIG. 28 schematically illustrates the construction of a plasma CVD apparatus which employs ion acceleration method by DC bias as one of conventional examples.

In FIG. 28, the numeral 131 indicates a substrate comprising, for example, a flexible synthetic resin film, 132 indicates a unwind roller for continuously feeding the substrate 131, 133 indicates a DC source connected to the unwind roller 132, 134 indicates an intermediate roller guiding the substrate 131, 135 indicates a rotating drum, 136 indicates a plasma tube, 137 indicates a high-frequency coil wound around the plasma tube 136, 138 indicates a high-frequency electric source which applies a high frequency to the high-frequency coil 137, 139 indicates an anode provided in the plasma tube 136, 140 indicates a DC source connected to the anode 139, 141 indicates a gas inlet formed at the plasma tube 136, and 142 indicates a wind roller which takes up the substrate 131.

According to the method which comprises exciting plasma by the high-frequency coil 137 wound around the plasma tube 136 and applying a bias voltage to the substrate 131 having electrical conductivity by the DC source 133, an ionic current flows through the conductive part of the substrate 131 as shown by arrow 143.

Furthermore, as shown in FIG. 28, in the case of the method of applying a bias voltage from the anode 139 opposite to the side of the substrate 131 with the plasma intervening therebetween, a path for liberating ions from the substrate 131 must be provided in order to prevent the substrate 131 from charging with ion, and an ionic current similarly flows in the direction of arrow 143.

As mentioned above, except for the case of electric resistance of the substrate being very small or very large, when an ionic current flows through the substrate having electric conductivity, a large quantity of Joule's heat is generated by the ionic current to cause decrease in film forming speed and damage of the substrate.

In order to diminish the heating of substrate caused by the ionic current, there was proposed a means according to which one or a plurality of potential rollers are provided on a film of a cooled rotating drum to localize the ionic current onto only the cooled rotating drum and further to divide the current as shown in FIG. 29 (JP-B-7-105037).

In FIG. 29, 151 indicates a substrate comprising a synthetic resin film or the like, 152 indicates a unwind roller for continuously feeding the substrate 151, 153 indicates an intermediate roller for guiding the substrate 151, 154 indicates a rotating drum, 155 indicates a plurality of plasma tubes, 156 indicates a high-frequency coil wound around each of the plasma tubes 155, 157 indicates an anode provided in each of the plasma tube 155, 158 indicates a DC source connected to the anode 157, 159 indicates a gas inlet pipe connected to each of the plasma tubes 155, 160 indicates a wind roller which takes up the substrate 151, and 161 indicates a potential roller for applying a bias voltage.

According to the apparatus shown in FIG. 29, the total quantity of ionic current is the same as in the apparatus shown in FIG. 28 and a sharp reduction of heat which flows into the substrate 151 cannot be attained. Thus, the method of applying a bias voltage using a DC source (same as the method of applying a low-frequency bias which can be regarded to be a direct current as for plasma even though it is alternating current) cannot still solve the defect that the film forming speed is limited by ionic current in the method of film formation with a large ion introduction amount.

In order to increase cooling efficiency of substrate, there is proposed a means of enhancing the close contact between the substrate and the rotating drum utilizing the electrostatic adsorption by applying a high DC voltage between the substrate and the rotating drum.

In this DC biasing method, since the substrate 151 moves, the voltage of potential roller 161 must be adjusted by passing electricity through a slip ring or rotary joint, but when the contact face with the slip ring is soiled or stick slip occurs, the voltage varies and quality of the resulting film is apt to become ununiform.

Furthermore, when the bias applying anode 157 is at high potential, plasma potential increases and abnormal discharging is apt to occur. Moreover, it is difficult to uniformly perform the ion acceleration over a wide area. In addition, owing to charging of the substrate, dusts attach to the substrate and the substrate is apt to be soiled.

As explained above, the method of applying bias voltage using a DC source is high in technical difficulty from the viewpoints of broad and high-speed film formation.

Generation of Joule's heat caused by ionic current can almost be avoided by employing a high-frequency self-biasing method which effects ion acceleration by so-called self-bias voltage by applying a high frequency of 13.56 MHz to the substrate. This is because ionic current flows in the direction of thickness of the substrate and, furthermore, flows into the side of the rotating drum as a displacement current through electrostatic capacity of the insulating film. Moreover, this method has an advantage of easiness in formation of broad film since a uniform bias voltage can be generated all over the substrate.

FIG. 30 is a schematic view of a plasma CVD apparatus in which a high-frequency power is applied to cooling drum, and then excite plasma and simultaneously self-bias voltage is generated (JP-A-8-41645 and JP-A-8-49076). In FIG. 30, 171 indicates a substrate comprising, for example, a flexible synthetic resin film, 172 indicates a unwind roller for continuously feeding the substrate 171, 173 indicates an intermediate roller guiding the substrate 171, 174 indicates a rotating drum, 175 indicates a high-frequency electric source which applies a high frequency to the rotating drum 174, 176 indicates a gas inlet and 177 indicates a wind roller which takes up the substrate 171 formed.

According to this method, substantially no Joule's heat due to ionic current is generated, but a current generated by high-frequency power flows through the electrically conductive film of the substrate and the substrate-carrying system or wall of a vacuum tank to the earth side to generate a large quantity of Joule's heat. In order to prevent this high-frequency current, thorough high-frequency insulation must be performed, but this is very difficult because of the high frequency. If even a slight electrostatic capacity is present between thin film and earth potential, the connection is completed through this electrostatic capacity and, as a result, a high-frequency current flows through the thin film as shown by arrow 78 to generate a large quantity of Joule's heat. Moreover, breakage of the conductive film of the substrate occurs due to the over current generated in this case.

As a result of further detailed investigation, it has been found that even if the high-frequency insulation is lost, when bias voltage is increased, over current flows or abnormal discharging occurs in the vicinity of the portion where the substrate begins to contact with the rotating drum and the portion where the substrate begins to leave the drum to cause breakage of the conductive film or substrate. It is considered that this is because electrostatic capacity is large in the vicinity of the portions. Moreover, dielectric heating of the insulating base film caused by high-frequency bias cannot be ignored.

Furthermore, a method has been proposed which applies a DC bias to the plasma exciting side and further applies a pulse-like high-frequency bias of several hundred kHz to the substrate side (JP-A-8-69622). This method also applies a DC bias voltage, and therefore the ions flowing into the substrate must be liberated by earthing. If the ions are not liberated, the substrate is charged and immediately it becomes impossible to apply the bias voltage. It has been admitted that the bias application by the earth type pulse high frequency to the substrate side has an effect to enhance the plasma density, but substantially no contribution to the bias voltage has been recognized. Therefore, it is considered that the pulse high frequency performs only a secondary part as bias.

SUMMARY OF THE INVENTION

The first object of the present invention is to provide a plasma CVD apparatus which can continuously form a film of good quality without causing any damage or deterioration of a substrate and which is free from the problems seen in conventional techniques.

The second object of the present invention is to provide a plasma CVD apparatus which can form a uniform film with no unevenness in thickness even after the formation of film is conducted for a long period of time.

The third object of the present invention is to provide a plasma CVD apparatus which hardly forms dusts even if the formation of film is conducted for a long period of time.

The fourth object of the present invention is to provide a plasma CVD apparatus which causes no damage of substrate at the time of film formation.

The present first invention for attaining the first object relates to a plasma CVD apparatus by which a film is continuously formed by plasma on the surface of a substrate having electrical conductivity and moving on a rotating drum through a roller system, characterized in that the total of impedances between earth potential and roller surface of all rollers provided in the route from a unwind roller for the substrate to the rotating drum is 10 kΩ or more and the total of impedances between earth potential and roller surface of all rollers provided in the route from the rotating drum to a wind roller is 10 kΩ or more, and a blocking condenser intervenes between the substrate and a high-frequency electric source for applying high frequency to the substrate.

The present second invention for attaining the second object is a plasma CVD apparatus which forms a film on a substrate by generating a plasma with a microwave, characterized in that a window for introducing microwave has a double structure comprising a window for maintaining vacuum and a window for confining plasma.

The present third invention for attaining the third object is a plasma CVD apparatus which forms a film on a substrate by generating a plasma, characterized in that a hood is provided for restricting the zone where plasma is generated and the portion of the hood which contacts with plasma is heated to a surface temperature of 150° C. or higher.

The present fourth invention for attaining the fourth object is a plasma CVD apparatus which forms a film by applying a high-frequency self-bias voltage to a substrate at least a part of which has electrical conductivity and which moves on a rotating drum through a roller system, characterized in that potential difference between the rotating drum and the electrically conductive part of the substrate is in the range of 20–1000 V.

The present fifth invention for attaining the third object is a plasma CVD apparatus which forms a film on a substrate by generating plasma near the substrate surface, characterized in that a continuous base film other than the substrate is provided in the zone where plasma is generated and the base film on which a plasma CVD film is deposited is taken up in succession.

Figure 1:
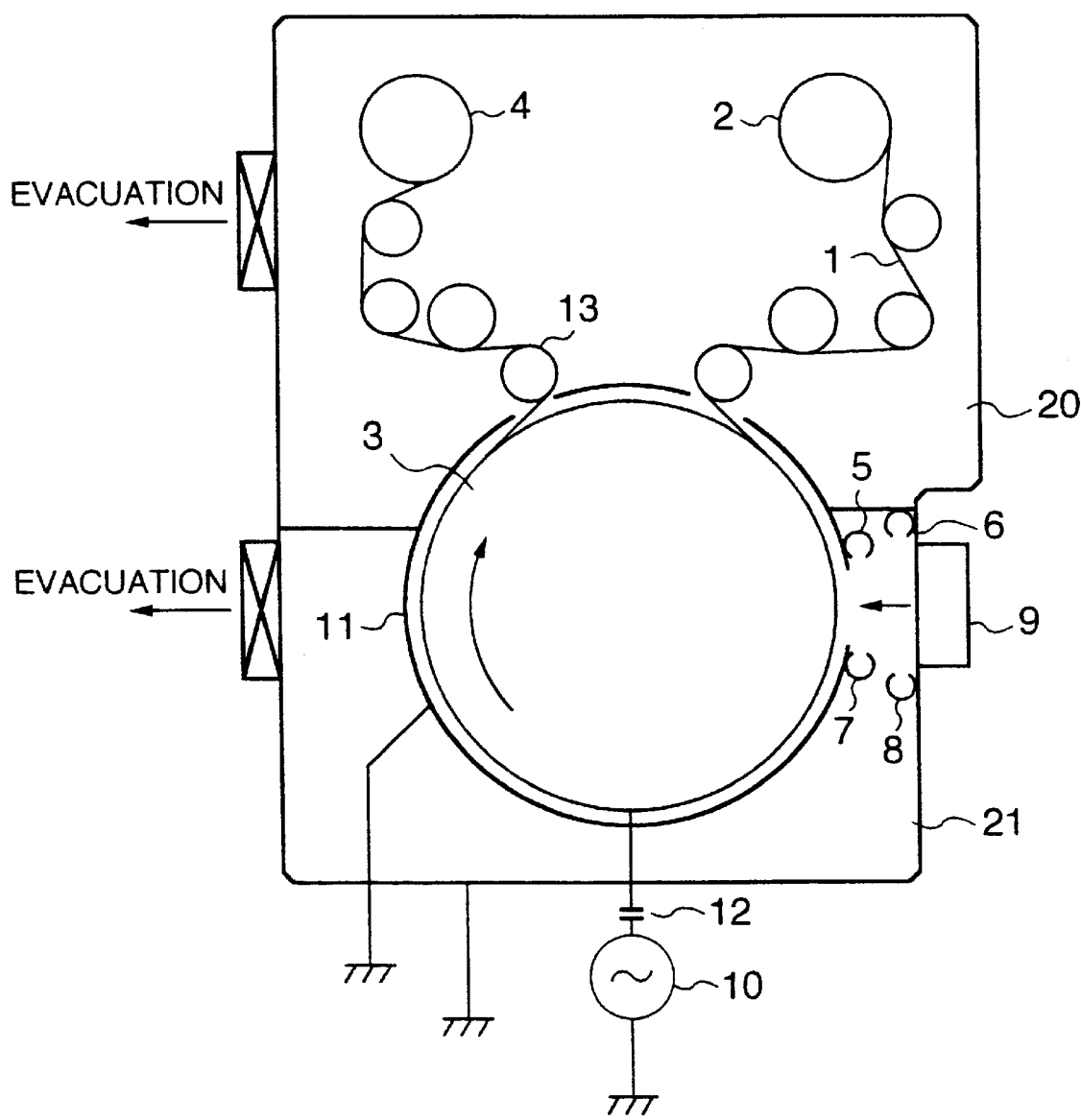
FIG. 1 is a schematic view of a continuous plasma CVD apparatus according to the first embodiment of the present invention.

In the drawings, the reference numerals indicates the following.

1 Substrate
2 Unwind roller
3 Rotating drum
4 Wind roller
5, 6, 7, 8 Gas inlet
9 Microwave linear applicator
10 High-frequency electric source
11 Barrier
12 Blocking condenser
13 Intermediate roller
14 Core
15 Taper corn
22 Magnetic layer
23 Protective film
25 MW introduction window for maintaining vacuum
26 MW introduction window for confining plasma
27 Plasma generation zone
28 Disk-like substrate
33 Hood
34 Heater
35 Supporting part
38 Fin
40 Fluorocarbon resin
41 Alumina plasma flame sprayed film
42 Roller core body
43 Roller body
44 Roller surface layer
53a, 53b, 55a, 55b Gas inlets
54 Plasma tube 60 Gas outlet
61 Base film
62 Unwind roller
63 Wind roller
64 Intermediate roller

DETAILED DESCRIPTION OF THE INVENTION

The present invention relates to a continuous plasma CVD apparatus for continuously forming, for example, a carbon thin film on the surface of a substrate having electrical conductivity such as a synthetic resin film having an electrically conductive thin film on the surface or a synthetic resin film containing an electrically conductive fine powder, characterized by having a high-frequency self-bias generation mechanism which uses a frequency greatly lower than in conventional apparatuses and a substrate-carrying system in which the impedance between the substrate and earth potential is greatly increased as mentioned above.

In order to attain the above first object, it is first necessary to avoid generation of Joule's heat caused by ionic current. Therefore, the inventors have investigated in detail the state of occurrence of damages in the substrate in conventional high-frequency self-biasing method. As a result, it has been found that damages occur even after high-frequency insulation of the substrate-carrying system has been considerably completely performed. Especially, the substrate is apt to be damaged between a cooled rotating drum and a guide roll near the rotating drum and the damage is generally greater than in DC biasing method.

It sometimes occurs that when bias power is increased, the electrically conductive film is broken instantaneously upon application of bias. Furthermore, even when substantially no damage is seen at low bias power, wrinkles of the substrate occur on the rotating drum and the wrinkled portions suffer from heat at the time of film formation.

As a result of investigating the conditions for preventing the damages and wrinkling, it has been found that the quantity of heat generated per unit area of the substrate due to high-frequency current must be controlled to 150 mW/cm$^2$ or less, preferably 50 mW/cm$^2$ or less. Moreover, it has been found that in order to meet this condition, the frequency of bias must be greatly reduced and simultaneously the high-frequency insulation (impedance) of the substrate-carrying system must be increased to more than a certain value.

Therefore, reduction of the bias frequency is investigated. It is known that, normally, when the high-frequency is lower than 1 MHz, the substrate is charged and self-bias voltage cannot be effectively applied. (See "Diamond and Diamond-Like Films and Coatings" edited by R. E. Ciausing et al., Plenum Press, New York, 1991, p247). Thus, the range of from 1 MHz to 10 MHz has been examined, but no sufficient condition where damage does not occur could not be found. Furthermore, although it has been found that the troubles of flowing of over current or occurrence of abnormal discharging in the vicinity of the portion where the substrate begins to contact with the rotating drum and the portion where the substrate begins to leave the drum can be diminished by reducing the frequency, these troubles could not be completely prevented. Thus, it has been found that the frequency must be further reduced to avoid the damage.

Therefore, a mechanism for generation of self-bias of 1 MHz or lower was experimentally and theoretically studied in detail. As a result, it has been found that the self-bias voltage in this range of frequency is a function of ionic current, electrostatic capacity of blocking condenser of high-frequency source, thickness of substrate, dielectric constant of substrate, plasma density, high-frequency input voltage, or the like.

When the ionic current is large, the capacity of blocking condenser is small and the thickness of substrate is great, there are conspicuously recognized distortion of bias wave form and decrease of bias voltage which are considered to be caused by charging of the substrate. However, it has been found that if the following proper conditions are selected, a sufficient bias voltage can be obtained. It has further been found that abnormal discharging can also be completely inhibited.

That is, according to the present first invention the frequency of high-frequency bias is in the range of 50–900 KHz, preferably 150–600 KHz and a blocking condenser is provided between a high-frequency source and a thin film having electrical conductivity so that the product C·f of electrostatic capacity C and frequency f of high frequency is 0.02 (F·Hz) or more, preferably 0.3 or more. And then the object can be attained in such a way that the total of impedances of all rollers in the route of from a substrate unwind roller to a rotating drum is at least 10 k$\Omega$, preferably 20 k$\Omega$ or more and the total of impedances of all rollers in the route of from the rotating drum to a wind roller is at least 10 k$\Omega$, preferably 20 k$\Omega$ or more as high-frequency insulation of the substrate-carrying system.

Since according to this construction a sufficient self-bias voltage is applied, DC voltage is not needed. Therefore, problems which are caused when the self-bias voltage is applied as DC, namely, generation of Joule's heat caused by ionic current, ununiform and unstable bias voltage, abnormal discharging and attaching of dusts due to charging of the substrate can be solved.

The impedance here is a value obtained by carrying out measurement in the following manner. That is, an aluminum foil is wound around a roller all over the width once or twice and the impedance between this aluminum foil and earth potential is measured by an impedance meter. The thus obtained value is the impedance here.

In this way, the unstability and ununiformity of bias voltage applied to the rotating drum can be solved by the above means, but in order to ensure the uniformity of film, it is necessary to make uniform the distribution of plasma density. For this purpose, it is effective to use microwave as a main source for generation of plasma. The electric field of microwave can easily be made uniform by adjusting form of antenna.

Furthermore, it is also effective to form the body or a part of the roller for carrying the substrate (unwind roller, wind roller, intermediate roller, etc.) using electrically insulating materials such as ceramics and synthetic resins or to use an electrically insulating material as core material of the rollers or to use hollow rollers having no conductive core material.

The present second invention is a plasma CVD apparatus which forms a film on a substrate by generating plasma with a microwave, characterized in that a window for introducing microwave has a double structure comprising a window for maintaining vacuum and a window for confining plasma. By employing such construction, it is possible to form a uniform film less in unevenness of thickness even when formation of the film is carried out for a long term.

The present third invention is a plasma CVD apparatus which forms a film on a substrate by generating a plasma, characterized in that a hood is provided for restricting the zone where plasma is generated and the portion of the hood which contacts with plasma is heated to a surface temperature of 150° C. or higher. By employing such construction, contamination of the substrate can be effectively inhibited which is caused by sticking of the plasma CVD film even when a long-term film formation is carried out.

The present fourth invention is a plasma CVD apparatus which forms a film by applying a high-frequency self-bias voltage to a substrate at least a part of which has electrical conductivity and which moves on a rotating drum through a roller system, characterized in that the potential difference between the rotating drum and the electrically conductive part of the substrate is specified to be in the range of 20–1000 V, whereby damage of the substrate at the time of film formation can be effectively inhibited.

The present fifth invention is a plasma CVD apparatus which forms a film on a substrate by generating plasma near the substrate surface wherein a continuous base film other than the substrate is provided in the zone where plasma is generated and the base film on which a plasma CVD film is deposited is taken up in succession, whereby sticking of dusts to the substrate can be effectively inhibited.

As mentioned above, according to the present first invention, the total of impedances between earth potential and roller surface of all rollers provided in the route of from a substrate unwind roller to a rotating drum is specified to be 10 k$\Omega$ or more, and the total of impedances between earth potential and roller surface of all rollers provided in the route of from the rotating drum to a wind roller is specified to be 10 k$\Omega$ or more, and a blocking condenser is provided between the substrate having electrical conductivity and a high-frequency source which applies a high frequency to the substrate, whereby a sufficient self-bias voltage is applied and therefore no DC voltage is needed. Thus, problems which occur when the self-bias voltage is applied as DC, namely, generation of Joule's heat caused by ionic current, ununiform and unstable bias voltage, abnormal discharging and attaching of dusts due to charging of the substrate can be all solved.

Such effects can be further surely exhibited when the frequency of high-frequency source is in the range of 50–900 KHz, preferably 150–600 KHz, and a blocking condenser which gives the product C·f of electrostatic capacity C and frequency f of high-frequency source of 0.02 [F·Hz] or more, preferably 0.3 [F·Hz] or more is provided between the high-frequency source and the substrate having electrical conductivity.

Furthermore, in order to ensure the uniformity of film, it is necessary to make uniform the distribution of plasma density. For this purpose, it is effective to use microwave as a main source for generation of plasma. The electric field of microwave can easily be made uniform by adjusting the form of antenna.

Moreover, it is also effective to make the rollers for carrying the substrate (unwind roller, wind roller, intermediate roller, etc.) or a part thereof using electrically insulating materials such as ceramics and synthetic resins or to use an electrically insulating material as a core material of the rollers or to use hollow rollers having no conductive core material.

The second invention is a plasma CVD apparatus which forms a film on a substrate by generating a plasma with a microwave, characterized in that a window for introducing microwave has a double structure comprising a window for maintaining a vacuum and a window for confining the plasma. By employing such construction, it is possible to form a uniform film less in unevenness of thickness even when formation of the film is carried out for a long time.

The third invention is a plasma CVD apparatus which forms a film on a substrate by generating a plasma, characterized in that a hood is provided for restricting the plasma generation zone and the portion of the hood which contacts with plasma is heated to a surface temperature of 150° C. or higher. By employing such construction, contamination of the substrate can be effectively inhibited which is caused by deposition of the plasma CVD film even when a long-term film formation is carried out.

The fourth invention is a plasma CVD apparatus which forms a film by applying a high-frequency self-bias voltage to a substrate at least a part of which has electrical conductivity and which moves on a rotating drum through a roller system, characterized in that the potential difference between the rotating drum and the electrically conductive part of the substrate is specified to the range of 20–1000 V, whereby damage of the substrate at the time of film formation can be effectively inhibited.

The fifth invention is a plasma CVD apparatus which forms a film on a substrate by generating plasma near the substrate surface wherein a continuous base film other than the substrate is provided in the plasma generation zone and the base film on which a plasma CVD film is deposited is taken up in succession, whereby deposition of dusts to the substrate can be effectively inhibited.

DESCRIPTION OF PREFERRED EMBODIMENTS

Figure 2:
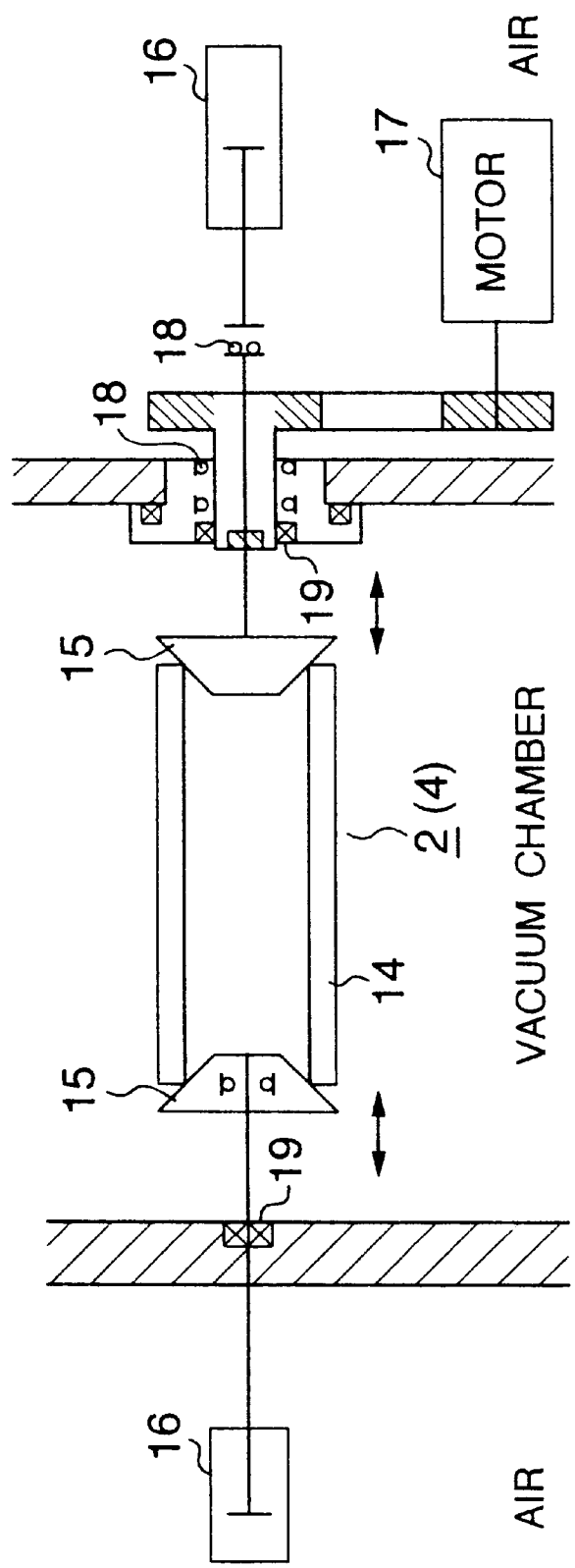
FIG. 2 shows construction of an unwind roller and a wind roller used in the continuous plasma CVD apparatus.
Figure 3:
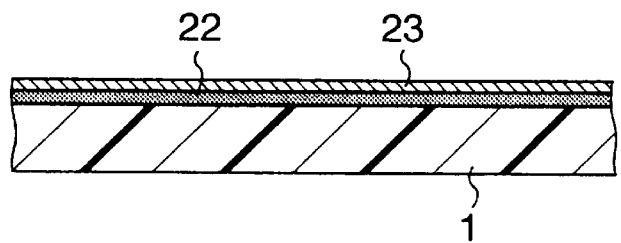
FIG. 3 is an enlarged sectional view of a magnetic recording medium produced by said continuous plasma CVD apparatus.

FIG. 1 is a schematic view of a plasma film forming apparatus for the formation of plasma CVD films according to an embodiment of the present invention. FIG. 2 is a drawing which explains the construction of unwind roller and wind roller used in the plasma film forming apparatus. FIG. 3 is an enlarged sectional view of a magnetic recording medium on which a protective film was formed by said plasma film forming apparatus.

An embodiment of the present invention will be explained referring to the drawings. A continuous and broad substrate 1 having electrical conductivity is continuously fed from unwind roller 2 and film formation is carried out by passing the substrate on the peripheral surface of a rotating drum 3 in cooled state which rotates at a given speed, followed by successively taking up it by wind roller 4.

The rotating shaft (core) and body of the unwind roller 2 and the wind roller 4 are formed of ceramics, synthetic resins, glass fibers, composites thereof and the like. Alternatively, the roller body is formed of ceramics, synthetic resins, glass fibers, composites thereof and the like, and the rotating shaft is mainly composed of a cylindrical core 14 and ceramics taper corns 15 supporting both ends of the core and the roller has a hollow structure having no rotating shaft as shown in FIG. 2. In FIG. 2, 16 indicates an air cylinder, 17 indicates a motor, 18 indicates a bearing, and 19 indicates a seal.

In FIG. 1, from gas inlets 5, 6, 7 and 8 are fed monomer gases comprising hydrocarbon gases such as methane, ethane, ethylene, acetylene, butane, benzene and hexane, inactive carrier gases such as argon, helium, neon, cryptone, xenon and radon, and active carrier gases such as nitrogen, hydrogen, carbon dioxide, carbon monoxide and oxygen simultaneously or from different gas inlets as required at a given ratio. From the point of stability of plasma, it is desired to introduce the carrier gases from gas inlets 6 and 8 present near the microwave introducing window and the monomer gases from gas inlets 5 and 7 present near the substrate. When the gases are introduced in this way, contamination of surroundings due to sticking of film can be inhibited.

These gases are kept in plasma state by microwave (MW) applied from microwave linear applicator 9, and a plasma CVD film is continuously formed on the outer surface of the carried substrate 1.

A self-bias voltage is applied to the rotating drum 3 by high-frequency source 10 through blocking condenser 12, and a broad and uniform plasma CVD film is continuously formed on the substrate 1. The frequency of the high-frequency source is 50–900 KHz, preferably 150–600 KHz. The numeral 11 indicates a barrier which is provided along the peripheral surface of the rotating drum 3 and limits the plasma generation area, 13 indicates an intermediate roller for guiding which is made of ceramics, synthetic resins, glass fibers or composites thereof, and the like.

The rotating shaft of this intermediate roller 13 is made of ceramics, synthetic resins, glass fibers or composites thereof, and the like, or the intermediate roller has a structure having no rotating shaft like said unwind roller 2 and wind roller 4. Of course, the intermediate roller can have a structure of the body of the roller and the rotating shaft being integrated.

The degree of vacuum of carrying chamber 20 including the carrying system for substrate 1 and film forming chamber 21 for film formation can be independently controlled and the carrying chamber 20 is kept at a high vacuum at which plasma is not generated.

When a magnetic recording medium is produced by the continuous plasma CVD apparatus of the present invention, various flexible synthetic resin films comprising, for example, polyethylene terephthalate, polyethylene naphthalate, polysulfone, polyimide, polyamide, polyphenylene sulfide and polybenzoxazole are used as the substrate 1 as shown in FIG. 3. Thereon is formed a magnetic layer 22 comprising, for example, Co—O, Co—Ni, Co—Cr, Co—Fe, Co—Ni—Cr or Co—Pt—Cr by a means such as vapor deposition, sputtering, ion plating or ionization vapor deposition. This magnetic layer 22 imparts electrical conductivity to the substrate 1.

A continuous substrate 1 having the magnetic layer 22 is fed from the unwind roller 2 and a plasma CVD protective film 23 of a given thickness is formed on the magnetic layer 22 by plasma CVD method.

Table 1 shows construction and performances of the continuous plasma CVD apparatus when a diamond-like carbon film of 10 nm thick was formed on a substrate comprising a polyethylene terephthalate having a Co—O film of 0.15 $\mu$m thereon under the conditions of frequency of microwave: 2.45 GHz, input power: 3 kW, use of methane and argon as introduced gases: methane and argon at 3:1, degree of vacuum of carrying chamber 20: $5 \times 10^{-5}$ Torr, and degree of vacuum of film forming chamber 21: 0.07 Torr.

That is, Table 1 shows frequency of the high-frequency source 10; electrostatic capacity C of the blocking condenser 12; the product C·f of the electrostatic capacity C of the blocking condenser 12 and the frequency f of high-frequency source 10; the smaller value of the total of impedances of all rollers provided in the route of from the substrate unwind roller to the rotating drum or the total of impedances of all rollers provided in the route of from the rotating drum to the wind roller; material of the intermediate roller 13, presence or absence of the rotating shaft (core) and material of the shaft; materials of the unwind roller 2 and the wind roller 4, presence or absence of rotating shaft; volume resistivity of thin film ($O_2$ content in the obliquely vapor deposited film of Co-CoO was adjusted); results of still test on endurance of a produced magnetic tape (the magnetic tape was set in a deck and run in an environment of 40° C., 80% RH and a still time required for RF output reaching −5 dB was measured ) and damage of the substrate. The symbol "-" in the result of the still test means that the endurance was unmeasurable.

TABLE 1

| No. | Frequency f (KHz) | Blocking condenser C ($\mu$F) | C · F (F · Hz) | Impedance (k$\Omega$) | Still (min) | Damage of substrate | Material of intermediate roll |
|---|---|---|---|---|---|---|---|
| 1 | 30 | 0.7 | 0.021 | 50 | 5 | Non | Ceramics |
| 2 | 50 | 0.3 | 0.015 | 50 | 60 | Non | Ceramics |
| 3 | 50 | 0.4 | 0.02 | 50 | 120 | Non | Ceramics |
| 4 | 50 | 2.0 | 0.1 | 50 | 130 | Non | Ceramics |
| 5 | 150 | 0.1 | 0.15 | 50 | 150 | Non | Ceramics |
| 6 | 150 | 0.5 | 0.75 | 50 | >180 | Non | Ceramics |
| 7 | 600 | 0.034 | 0.02 | 50 | 140 | Non | Ceramics |
| 8 | 600 | 1.5 | 0.9 | 50 | >180 | Non | Ceramics |
| 9 | 900 | 0.023 | 0.02 | 50 | 130 | Non | Ceramics |
| 10 | 1000 | 0.02 | 0.02 | 50 | — | Non | Ceramics |
| 11 | 600 | 0.025 | 0.015 | 50 | 80 | Non | Ceramics |
| 12 | 900 | 0.015 | 0.014 | 50 | 90 | Non | Ceramics |
| 13 | 1000 | 1.5 | 1.5 | 50 | — | occurred | Ceramics |
| 14 | 1000 | 1.5 | 1.5 | 50 | — | Non | Ceramics |
| 15 | 1000 | 1.5 | 1.5 | 50 | — | Non | Ceramics |
| 16 | 600 | 1.5 | 0.9 | 8 | 60~160 | Partially occurred | Ceramics |
| 17 | 600 | 1.5 | 0.9 | 4 | — | Occurred | Ceramics |
| 18 | 600 | 1.5 | 0.9 | 6 | 28~130 | Partially occurred | SUS |
| 19 | 600 | 1.5 | 0.9 | 2 | — | Occurred | Ceramics |
| 20 | 600 | 1.5 | 0.9 | 11 | 150 | Non | Only one was Ceramics |
| 21 | 600 | 1.5 | 0.9 | 20 | >180 | Non | Only two were Ceramics |

TABLE 1-continued

| No. | Material of core of intermediate roll | Material of unwind roll and wind roll | Core of unwind roll and wind roll | Volume resistivity ($\Omega \cdot m$) | Main plasma source |
|---|---|---|---|---|---|
| 1 | Ceramics | Ceramics | Non | $1 \times 10^{-5}$ | Microwave |
| 2 | Ceramics | Ceramics | Non | $1 \times 10^{-5}$ | Microwave |
| 3 | Ceramics | Ceramics | Non | $1 \times 10^{-5}$ | Microwave |
| 4 | Ceramics | Ceramics | Non | $1 \times 10^{-5}$ | Microwave |
| 5 | Ceramics | Ceramics | Non | $1 \times 10^{-5}$ | Microwave |
| 6 | Ceramics | Ceramics | Non | $1 \times 10^{-6}$ | Microwave |
| 7 | Ceramics | Ceramics | Non | $1 \times 10^{-5}$ | Microwave |
| 8 | Ceramics | Ceramics | Non | $1 \times 10^{-5}$ | Microwave |
| 9 | Ceramics | Ceramics | Non | $1 \times 10^{-5}$ | Microwave |
| 10 | Ceramics | Ceramics | Non | $1 \times 10^{-5}$ | Microwave |
| 11 | Ceramics | Ceramics | Non | $1 \times 10^{-5}$ | Microwave |
| 12 | Ceramics | Ceramics | Non | $1 \times 10^{-5}$ | Microwave |
| 13 | Ceramics | Ceramics | Non | $1 \times 10^{-5}$ | Microwave |
| 14 | Ceramics | Ceramics | Non | $5 \times 10^{-2}$ | Microwave |
| 15 | Ceramics | Ceramics | Non | $1 \times 10^{-4}$ | Microwave |
| 16 | Ceramics | SUS | Non | $9 \times 10^{-8}$ | Microwave |
| 17 | SUS | Ceramics | Non | $1 \times 10^{-5}$ | Microwave |
| 18 | Ceramics | Ceramics | Non | $1 \times 10^{-5}$ | Microwave |
| 19 | Ceramics | Ceramics | SUS | $1 \times 10^{-5}$ | Microwave |
| 20 | Ceramics | Ceramics | Non | $1 \times 10^{-5}$ | Microwave |
| 21 | Ceramics | Ceramics | Non | $1 \times 10^{-5}$ | Microwave |

Results of the Tests:

Sample No. 1: Since frequency of the high-frequency source 10 is low, namely, 30 KHz, quality of film is deteriorated, and, therefore, results of the still test are bad.

Sample No. 2: Though frequency of the high-frequency source 10 is 50 KHz, electrostatic capacity C of the blocking condenser 12 is small, namely, 0.3 $\mu$F and accordingly the value of C·f is 0.015, and therefore the bias voltage is not sufficiently applied due to charging, and, thus, results of the still test are also insufficient.

Sample Nos. 3–9 and 20–21: Since frequency of the high-frequency source 10 is 50–900 KHz and the value of C·f is 0.02 or more (in the range of 0.02–1), a sufficient self-bias voltage is applied at the time of film formation and as a result no damage is seen in the thin film and a uniform diamond-like carbon film is formed. Therefore, results of the still test are 120 minutes or more and wear resistance is excellent.

Sample No. 10: Though the value of C·f is 0.02, frequency of the high-frequency source 10 is high, namely, 1000 KHz. Therefore, diminishment of high-frequency current is insufficient, and thus the substrate is heated with the high-frequency current to cause damage and the still test was impossible to perform.

Sample Nos. 11 and 12: Though frequency of the high-frequency source 10 is 600 KHz and 900 KHz, electrostatic capacity C of the blocking condenser 12 is small, namely, 0.025 $\mu$F and 0.015 $\mu$F, and hence the value of C·f is smaller than 0.015, and the bias voltage is not sufficiently applied due to charging. Therefore, results of the still test are insufficient.

Sample No. 13: Though the value of C·f is 0.9, frequency of the high-frequency source 10 is high, namely, 1000 KHz. Therefore, diminishment of high-frequency current is insufficient, and thus the substrate is heated with the high-frequency current to cause damage and the still test was impossible to perform.

Sample Nos. 14–15: Frequency of the high-frequency source 10 is high, namely, 1000 KHz like Sample No. 13, but since volume resistivity of the thin film of Sample No. 14 is high and that of Sample No. 15 is low, heating of the substrate with high-frequency current did not occur. However, since $O_2$ content in the obliquely vapor deposited film of Co-CoO was adjusted to change the volume resistivity, magnetic characteristics were deteriorated and the still test was impossible to perform.

Sample Nos. 16–19: Though the value of C·f is 0.9, impedance of the roller system is small, namely, smaller than 10 k$\Omega$ and, hence, diminishment of high-frequency current is insufficient, and thus the substrate is heated with the high-frequency current to cause damage and the still test was insufficient.

As is clear from the above results, a dense and uniform thin film which meets the object all over the width can be obtained without causing damages in the substrate at the time of film formation when the total of impedances between earth potential and roller surface of all rollers provided in the route of from a substrate unwind roller to a rotating drum is at least 10 k$\Omega$ and similarly the total of impedances between earth potential and roller surface of all rollers provided in the route of from the rotating drum to a wind roller is at least 10 k$\Omega$, and a blocking condenser is provided between the substrate and the high-frequency electric source to give a value of C·f of 0.02 or more, and a frequency of high-frequency source is 50–900 KHz.

There is microwave (MW) plasma as one of plasma sources for producing films of high performance as mentioned above. In the case of MW, there is no need to provide electrodes in a discharge tube and the power can be locally concentrated, and hence it is possible to produce plasma of high density. When magnetic field is applied and ECR (electron cyclotron resonance) conditions are imparted, film formation at a high degree of vacuum becomes possible. When film formation at a high degree of vacuum is conducted, incorporation of impurities decreases and film quality is improved.

Figure 4:
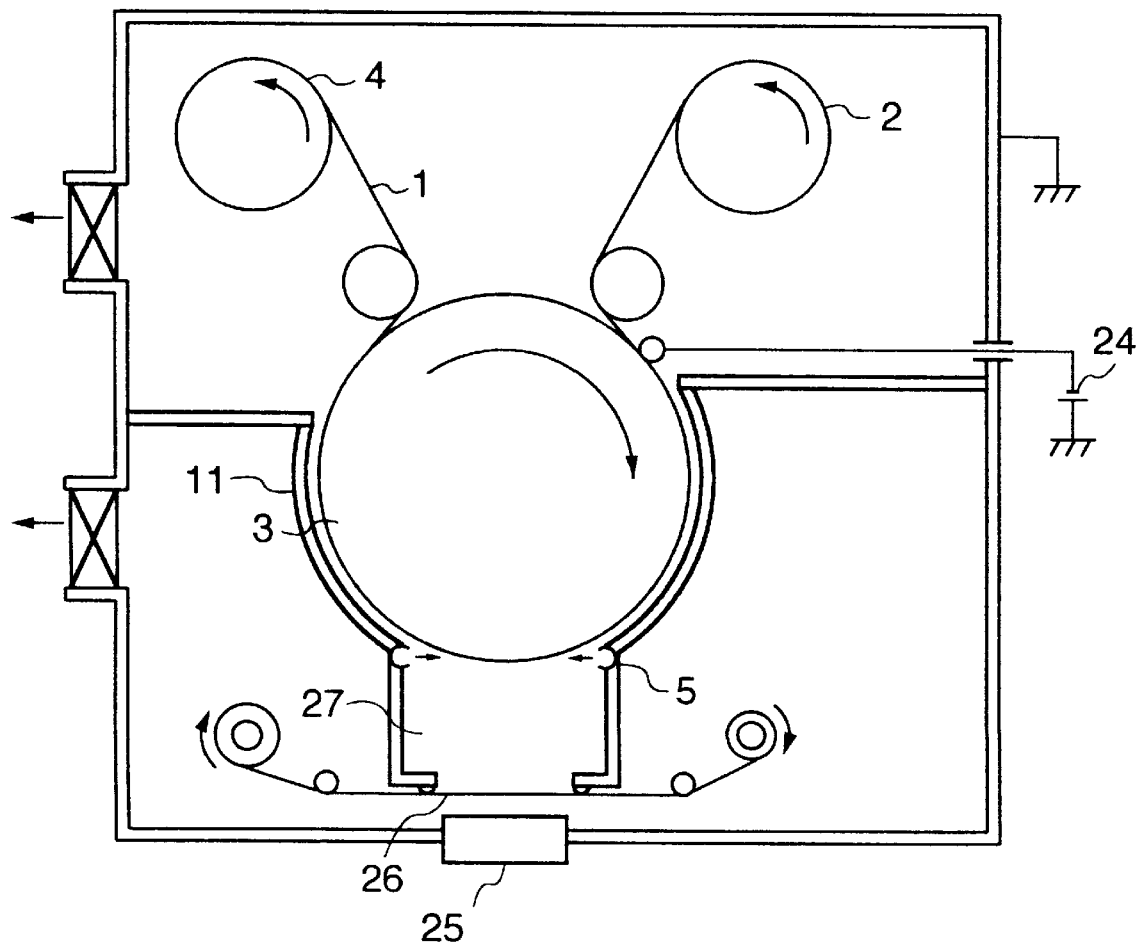
FIG. 4 is a schematic view of a continuous plasma CVD apparatus according to the second embodiment of the present invention.
Figure 5:
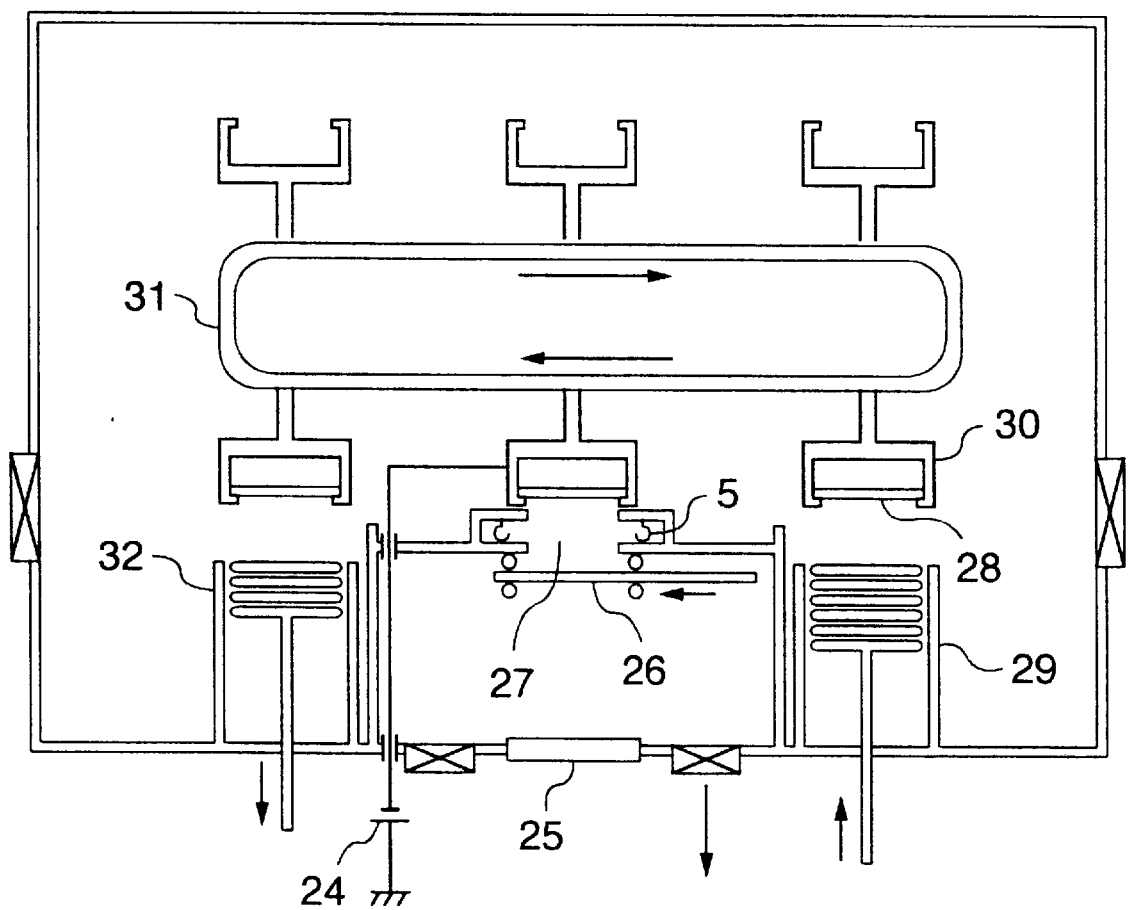
FIG. 5 is a schematic view of a continuous plasma CVD apparatus according to the third embodiment of the present invention.

FIG. 4 and FIG. 5 are schematic views of plasma film-forming apparatus according to the second and third embodiments for a further long-term stable film formation as compared with that of the first embodiments. That is, according to this plasma film-forming apparatus, plasma CVD film does not deposit on the MW introducing window in being exposed to plasma, so that the plasma state is stably maintained for a long period of time and a long-term stable film formation made possible. Thus, there is no need to clean the MW introducing window frequently and hence the productivity is improved.

As shown in FIG. 4, a continuous flexible substrate 1 is continuously or intermittently fed from feed roll 2, and film formation is carried out while it is on the peripheral surface of rotating drum 3, followed by taking up by wind roll 4.

A bias voltage is applied to the substrate 1 by DC source 24. From gas inlet 5 is introduced a mixed gas comprising hexamethyldisiloxane and oxygen as a raw material gas and a carrier gas (mixing ratio=3:7).

MW is introduced into plasma generation zone 27 through MW introducing window 26 which is for confinement of plasma from MW introducing window 25 which is for maintenance of vacuum. The MW introducing window 25 for the maintenance of vacuum is a window for maintaining vacuum and the MW introducing window 26 for the confinement of plasma is a window for confining plasma, and these windows form a double structure. The MW introduction window 25 for the maintenance of vacuum is disposed outside the MW introduction window 26 for the confinement of plasma and is not exposed to plasma. The space between the MW introduction window 25 for the maintenance of vacuum and the MW introduction window 26 for the confinement of plasma is highly vacuumized or the distance between these windows is less than the thickness of plasma sheath to prevent generation of plasma.

The MW introduction window 26 for the confinement of plasma comprises, for example, a continuous, MW-transmitting, heat resistant and flexible material having a thickness of 50 $\mu$m, such as a fluorocarbon resin, e.g., polytetrafluoroethylene, a mixture of the fluorocarbon resin with a filler, e.g., glass fiber or polypropylene. This is gradually taken up with lapse of time.

As a result, the plasma CVD film deposited on the surface of the MW introduction window 26 for the confinement of plasma which faces the plasma generation zone 27 is also moved together with the window 26, and a fresh part of the window 26 is always supplied at the plasma generation zone 27 and thus the plasma state is stably maintained for a long period of time.

In the above embodiment, a flexible material is used for the MW introduction window 26 for the confinement of plasma, but it is also possible to use a material in the form of a plate and move it in lateral direction. As the MW introduction window for the confinement of plasma, are used those materials which transmit MW (those which are low in reflection or absorption or those which are thin and substantially transmit MW even if high in reflection or absorption).

In the third embodiment illustrated in FIG. 5, there is shown an apparatus which forms a film by MW on a disk-like substrate. A disk-like substrate 28 made of glass is fed one by one from substrate feeding means 29 and supported by substrate holder 30. This is passed through the plasma generation zone 27 by a circulating carrying system 31, whereby a plasma CVD film is formed on the surface of the disk-like substrate 28. Then, the substrate is carried to a substrate receiving means 32.

A bias voltage is applied to the disk-like substrate 28 by DC source 24. Methane gas and argon gas as a raw material gas and a carrier gas are introduced at a ratio of 1:2 from gas inlet 5.

MW is introduced into plasma generation zone 27 through MW introduction window 26 for confinement of plasma from MW introduction window 25 for maintenance of vacuum. The space between the MW introduction window 25 for the maintenance of vacuum and the MW introduction window 26 for the confinement of plasma is highly vacuumized or the distance between these windows is less than the thickness of plasma sheath to prevent generation of plasma. The MW introduction window 26 for the confinement of plasma is made of a continuous quartz glass plate and is moved in lateral direction continuously or intermittently with lapse of time.

Figure 6:
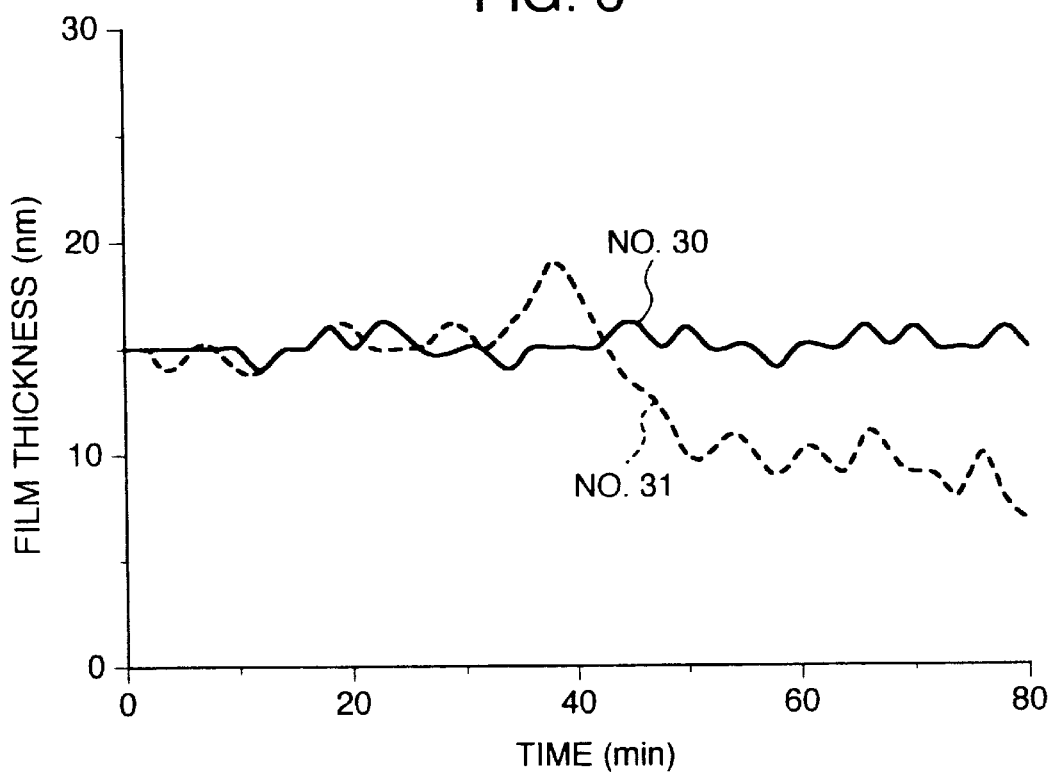
FIG. 6 is a graph which shows relationship between lapse of time and distribution of thickness of plasma CVD film.

FIG. 6 shows change of film thickness of Sample Nos. 30 and 31 with lapse of time. The Sample No. 30 was prepared by forming an $SiO_x$ film (x=1.7) of 15 nm thick using the plasma CVD apparatus shown in FIG. 4 on the surface of a substrate of a sheet-like magnetic recording medium comprising a polyethylene terephthalate (PET) film of 6 $\mu$m thick and a Co—O film of 0.15 $\mu$m thick vapor-deposited on the PET film. The Sample No. 31 was prepared in the same manner as above by forming an $SiO_x$ film (x=1.7) of 15 nm thick using a plasma CVD apparatus of the same structure as shown in FIG. 4 except that the MW introduction window for the confinement of plasma was not used.

Figure 7:
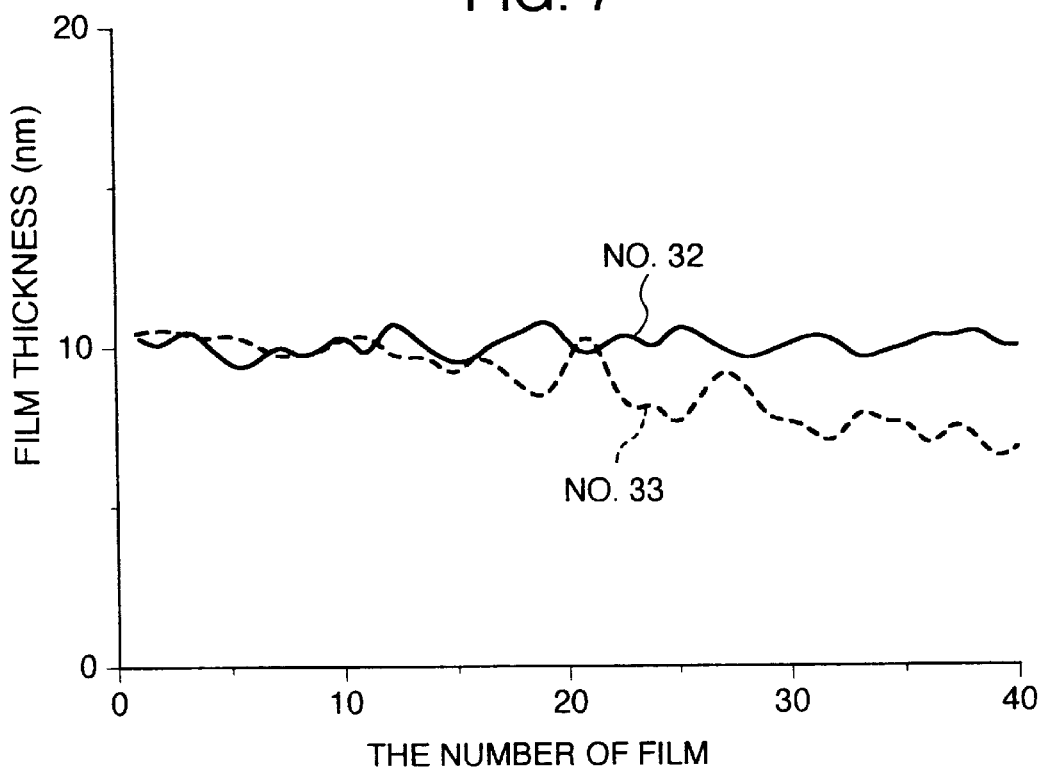
FIG. 7 is a graph which shows the relationship between the number of film and distribution of thickness of the plasma CVD film.

FIG. 7 shows change of film thickness of Sample Nos. 32 and 33 with an increase in the number of film. The Sample No. 32 was prepared by forming a diamond-like carbon film of 10 nm thick using the plasma CVD apparatus shown in FIG. 5 on the surface of a substrate of a disk-like magnetic recording medium comprising a disk made of glass and a Cr thin film of 50 nm thick and a Co—Cr thin film of 20 nm thick which were lamination sputtered on the glass disk. The Sample No. 33 was prepared in the same manner as above by forming a diamond-like carbon film of 10 nm thick using a plasma CVD apparatus of the same structure as shown in FIG. 5 except that the MW introduction window for the confinement of plasma was not used.

As can be seen from the results of FIG. 6 and FIG. 7, in the case of Samples Nos. 31 and 33 which were prepared without using the MW introduction window for the confinement of plasma, variation in thickness of the film film was great after carrying out the film formation for more than a certain period. On the other hand, when film formation was carried out using the apparatuses of FIG. 4 and FIG. 5, a uniform thickness was obtained over a long period of time.

In the continuous plasma CVD apparatus, the plasma CVD film is deposited not only on the substrate, but also on the parts exposed to plasma around the substrate. This plasma CVD film peels off owing to internal stress in the film when the thickness increases to some extent. Fragments of the film which peels off become dusts and contaminate the substrate and other portions.

For the solution of this problem, it is possible to confine high density plasma within a certain zone by providing a hood which restricts the film-forming zone (plasma generation zone). Furthermore, deposition of film on the parts exposed to plasma other than the parts on which the film is to be deposited can be prevented by maintaining the surface temperature of the hood which contacts with plasma at 150° C. or higher. The raw material gas components repeats deposition and dissociation on the substrate in plasma, and when this equilibrium state leans to the deposition side, film is formed. It is considered that since this equilibrium state leans to the dissociation side by the heating to 150° C. or higher, the film does not deposit on the hood.

Furthermore, if hydrogen gas or oxygen gas is introduced at the time of the heating, the effect to prevent deposition of film is further enhanced. This effect to prevent deposition of film by the heating is also effective for the above MN introduction window and by heating the MW introduction window to 150° C. or higher, stable film formation for a long time becomes possible.

When it is necessary to minimize the consumption electric power for the heating and to protect the portion inferior in heat resistance from thermally damages, the heated portion is fixed at very small area with using a material of low thermal conductivity, and furthermore a shielding plate for heat is provided between the heated portion of the hood and the non-heated portion such as the rotating drum and others in such a manner that it does not shield the film forming area of the substrate.

Specifically, a material of 50 W/m·K or lower in thermal conductivity is used for the fixing portion of the hood, and a heat shielding plate is inserted between heated portion and non-heated portion, whereby the heating of the surroundings can be easily diminished. Furthermore, the effect to diminish the heating of surroundings is increased by setting the contact area of the hood and the supporting member at an area ratio of 1/100 or less of the surface area of the heated portion of the hood.

The shielding plate is preferably cooled. However, if the cooled portion is exposed to plasma, film deposits thereon as mentioned above. Therefore, the distance between the hood and the shielding plate is kept at about the thickness of plasma sheath so that film does not deposit on the cooled shielding plate.

Moreover, when a self-bias voltage is applied to the substrate, if the film forming area is simply covered with the hood, sometimes a sufficient self-bias voltage cannot be applied. For solving the problem, a structure having a great surface area is provided inside the hood, whereby the area of the earth potential portion exposed to plasma is set at 6 times or more, preferably 9 times or more the area of the surface of the substrate exposed to plasma and thus the self-bias voltage can be stably applied.

Figure 8:
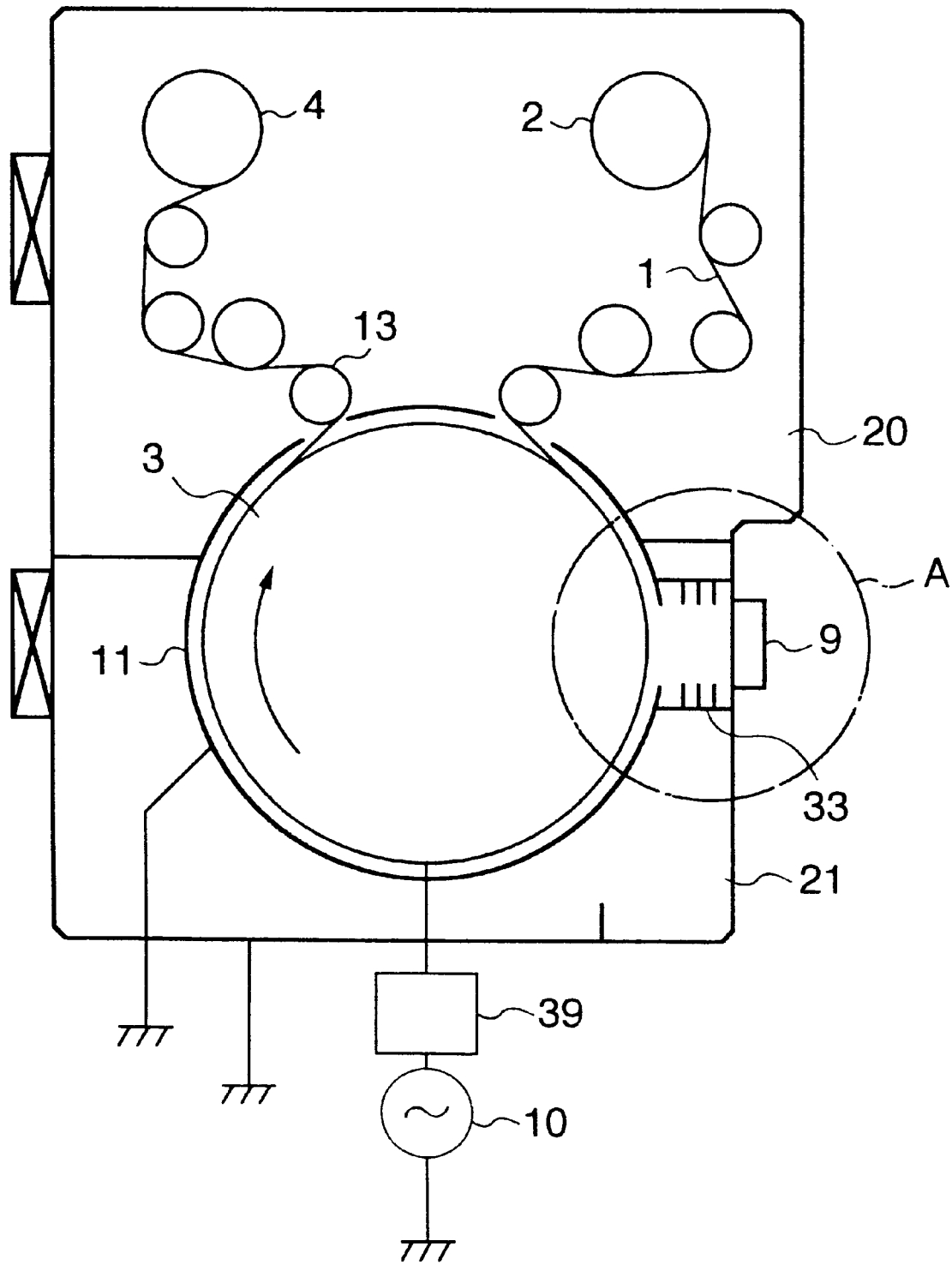
FIG. 8 is a schematic view of a continuous plasma CVD apparatus according to the fourth embodiment of the present invention.
Figure 9:
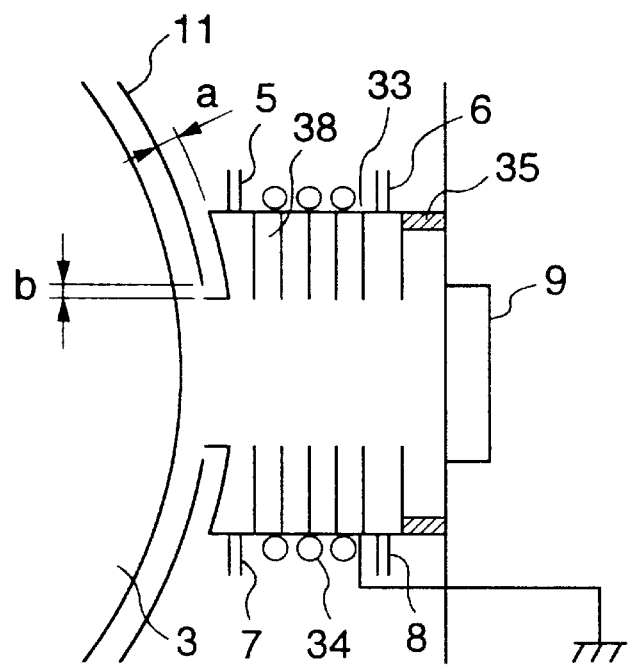
FIG. 9 is an enlarged schematic view of the part A in FIG. 8.
Figure 10:
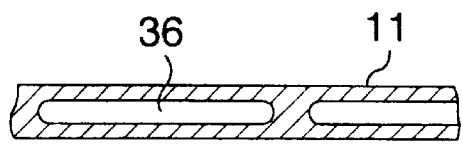
FIG. 10 is an enlarged sectional view of a partition used in the plasma CVD apparatus of FIG. 8.
Figure 11:
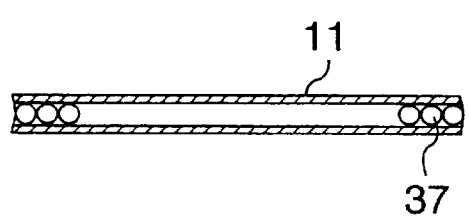
FIG. 11 is an enlarged sectional view of a partition used in the plasma CVD apparatus of FIG. 8.

FIG. 8 is a schematic view of a plasma CVD apparatus according to the fourth embodiment of the present invention, FIG. 9 is an enlarged schematic view of the portion A in FIG. 8, and FIG. 10 and FIG. 11 are enlarged sectional views of partitions used in the plasma CVD apparatus.

This embodiment will be explained below referring to the drawings. The carrying route for substrate 1 and others are the same as in FIG. 1 and explanation of them is omitted. From gas inlets 5 and 7 shown in FIG. 9 is fed a monomer gas comprising a hydrocarbon gas and from gas inlets 6 and 8 is fed a carrier gas at a given ratio. These gases are kept in a plasma state by microwave applied from microwave linear applicator 10, and a plasma CVD film is continuously formed on the outer surface of the carried substrate 1.

Plasma is restricted in its generation zone by hood 33 made of aluminum. The surface of this hood 33 which contacts with plasma is kept at 150° C. or higher by heater 34. Hood 33 is fixed to an earth potential structure such as a vacuum tank wall at a very small contact area by supporting member 35 made of a material of 50 W/m·K or lower in thermal conductivity, such as ceramics, thereby to minimize escape of heat due to thermal conduction.

Partition 11 which serves also as a heat shielding plate is provided between the heated portion and non-heated portion such as rotating drum 3 to prevent the damage of substrate 1 caused by heat emission. As shown in FIG. 10, the partition 11 has a continuous hollow portion 36 and cooling water passes therethrough or as shown in FIG. 11, cooling pipe 37 through which cooling water passes is provided, and the partition 11 is kept at 100° C. or lower by these cooling means.

Thin plate-like fins 38 are arranged in the hood 33 to increase the earth area. In this embodiment, thin plate-like fins 38 are used, but the invention is not limited thereto, and other fins such as pin fins and corrugated fins can also be used.

As shown in FIG. 8, a self-bias voltage is applied to the rotating drum 3 by high-frequency source 10 through matching box 39, and a wide and uniform plasma CVD film is continuously formed on the substrate 1.

Table 2 shows results of the test on the relation between presence or absence of the hood, the surface temperature of the hood which contacts with plasma and the deposition state of plasma CVD film when a diamond-like carbon film of 10 nm thick was formed under the following conditions using a substrate comprising a polyethylene terephthalate and a Co—O film of 0.15 $\mu$m thick formed thereon.

TABLE 2

| No. | Hood | Surface temperature | State of deposition of film |
| --- | --- | --- | --- |
| 41 | Not used | — | Deposited on the whole film-forming chamber. |
| 42 | Used | Room temperature | Deposited in a large amount on the inner surface of hood. |
| 43 | Used | 100° C. | Deposited in a small amount on the inner surface of hood |
| 44 | Used | 150° C. | Substantially no deposition |
| 45 | Used | 200° C. | Substantially no deposition |

Frequency of microwave: 2.45 GHz

Input electric power: 3 kW

Introduced gases: Methane and argon (at 3:1)

Degree of vacuum in carrying chamber: $5 \times 10^{-5}$ Torr

Degree of vacuum in film forming chamber: 0.07 Torr

Thermal conductivity of supporting member: 20 W/m·K

Heat shielding plate (partition): Used.

Self-bias voltage applied to substrate: 200 V

Area ratio of earth potential portion of hood to area of the substrate exposed to plasma: 10 times Area ratio of contact area of hood and supporting member and surface area of heated portion of hood: 1/150

Test Results:

In the case of Sample No. 41, since the hood was not used, plasma spread in the whole vacuum tank and plasma CVD film deposited on a wide area.

In the case of Sample No. 42, plasma was confined in the hood, but a large amount of plasma CVD film deposited on the inner surface of the hood because the hood was not heated.

In the case of Sample No. 43, the hood was heated, but a small amount of plasma CVD film deposited on the inner surface of the hood because the heating was insufficient.

In the case of Sample Nos. 44 and 45, the hood was sufficiently heated and hence substantially no plasma CVD film deposited on the inner surface of the hood.

Accordingly, when a hood restricting the film forming zone (plasma generation zone) is provided and the surface temperature of the hood contacting with plasma is kept at 150° C. or higher, deposition of the film on the hood can be prevented. Hereupon, the temperature of 150° C. or higher is measured by a thermocouple. At the time of generation of plasma, it is considered that the temperature is further elevated owing to the heat of plasma.

Table 3 shows results of the test on the relation between heater electric power and thermal conductivity of the supporting member (material) when the hood was used and heated so as to keep the surface temperature at 160° C. and the thermal conductivity was changed. Other conditions of the test were the same as above.

TABLE 3

| No. | Thermal conductivity | Heating electric power |
| --- | --- | --- |
| 46 | 20 W/m · K | 1.8 kW |
| 47 | 50 W/m · K | 2.0 kW |
| 48 | 80 W/m · K | 3.5 kW |

When thermal conductivity of the supporting member is high as of Sample No. 48, superfluous heater electric power is consumed and this causes increase in running cost. On the other hand, when the thermal conductivity of the supporting member is 50 W/m·K or lower as of Sample Nos. 46 and 47, release of heat to the out-side of the apparatus is inhibited, and plasma CVD film is effectively formed with a small heater electric power and thus running cost can be reduced.

Table 4 shows results of the test on the relation between bias voltage and ratio of the area of earth potential portion (surface area of the fin) in the hood to the area of the substrate exposed to plasma in the test were the ratio was changed. Other conditions of the test were the same as above.

TABLE 4

| No. | Earth area ratio | Bias voltage |
| --- | --- | --- |
| 49 | 5 times | 40 V |
| 50 | 6 times | 170 V |
| 51 | 9 times | 195 V |
| 52 | 10 times | 200 V |

As a result of the test, when the area of the earth potential portion is about 5 times the surface area of the substrate exposed to plasma as of Sample No. 49, the bias voltage is low, namely, 40 V because of insufficient area ratio, and the self-bias voltage cannot be sufficiently applied to the substrate and the state of film formation is adversely affected.

On the other hand, when the earth area ratio is 6 times or higher, preferably 9 times or higher as of Sample Nos. 50–52, the self-bias voltage is stably applied to the substrate and film of good quality can be formed at good efficiency.

A great factor affecting film forming speed or film quality in plasma CVD method is bias voltage of substrate. As a method for application of this bias voltage, there is the above-mentioned high-frequency biasing method utilizing the self-bias voltage of high-frequency plasma, and this method hardly causes abnormal discharge and is stable, and due to the stability this method is suitable for film formation of long period of time.

According to this film forming method, heating by ionic current is less and damage of the substrate is less than DC bias method. When it is further necessary to completely prevent the substrate from being damaged, a potential difference between the rotating drum and the substrate is provided to allow the rotating drum and the substrate to electrostatically adsorb to each other, thereby to prevent floating of the substrate. The method to completely prevent the substrate from being damaged have been found by the inventors in consideration of the point that the rotating drum is usually cooled, and by mere cooling, the substrate floats up from the rotating drum during running of the substrate and the substrate undergoes heat damages. Thus, according to the method, when heat given by plasma at the time of film formation (striking energy generated by accelerated ion or heat carried by neutral particles) or Joule's heat generated by high-frequency current which flows from the substrate toward the earth when a high-frequency electric power is applied to the substrate is generated, it is possible to completely prevent the substrate from being damaged. Especially, when a substrate of low heat resistance is used, heat damages such as wrinkle, emboss, heat distortion, heat melting, and breakage are prevented. In addition to the heat resistance, surface properties of rollers become excellent.

For example, it has been found that in a continuous plasma CVD apparatus which continuously carries out the film formation by plasma with applying a high-frequency self-bias voltage to a substrate having electroconductivity, such as a synthetic resin film having an electrically conductive thin film formed on the resin surface, when a potential difference is present between the rotating drum and the electrically conductive portion of the substrate and the average potential difference is 20–1000 V, preferably 40–600 V, the substrate and the rotating drum adheres by electrostatic attraction, and the substrate can be prevented from being damaged by the heat of the substrate.

For providing the potential difference, a method which utilizes self-bias voltage applied to the substrate and furthermore a method which applies a DC voltage to the rotating drum are effective. The substrate and the rotating drum (roller system) must be electrically insulated from each other. Naturally, plasma must not be generated between the substrate and the rotating drum.

Usually, entering of plasma is prevented by providing an earth shield thinner than the thickness of the sheath of plasma. However, with increasing the plasma density at high film-forming speed, the thickness of the sheath of plasma decreases, and plasma is generated in even a very narrow space of 1–2 mm in interval, and, as a result, insulation by the earth shield becomes difficult. Therefore, electrical insulation between the substrate and the rotating drum is ensured by covering with an electrical insulant at least the portion of the rotating drum which contacts with plasma. Of course, the portion where plasma density is low and the sheath thickness of plasma is sufficiently thick can be insulated with earth shield with causing no problem.

Moreover, the surface smoothness of roller system is necessary for maintaining smoothness of the substrate. As mentioned above, if the surface smoothness of the rollers is inferior, the substrate undergoes fine deformation. Under the circumstances, the inventors have found that damage of the substrate caused by the surface of rollers can be substantially inhibited by making the revolving shaft (core material) of rollers with an electrical insulant (ceramics such as alumina and zirconia, hard glass, or the like) to maintain a sufficient impedance between the substrate and earth, and by covering the surface of rollers with a material having a Vickers hardness of 500 or higher and a surface roughness of 0.2 S or less.

Only by controlling the surface roughness to 0.2 S or less, the surface smoothness is gradually damaged due to contact sliding with the substrate at film formation, resulting in fine deformation and damage of the substrate. Therefore, it is necessary to increase hardness of the roller surface.

According to the present invention, above problems have been solved by constituting the roller body with a material which can be mirror polished or by constituting the roller body with an electrical insulant which cannot be mirror polished and covering it with a material which can be mirror polished, and thereafter polishing the surface to ensure the surface property, said material which can be mirror polished being selected from those having a Vickers hardness of 500 or higher.

The similar effect can be obtained by providing on the surface of roller body a sliding-resistant protective film (hard chromium plating, plasma CVD film, sputtering film, ion plating film, vapor deposition film, etc.) having a Vickers hardness of 500 or higher instead of adjusting the hardness of the roller body.

Figure 12:
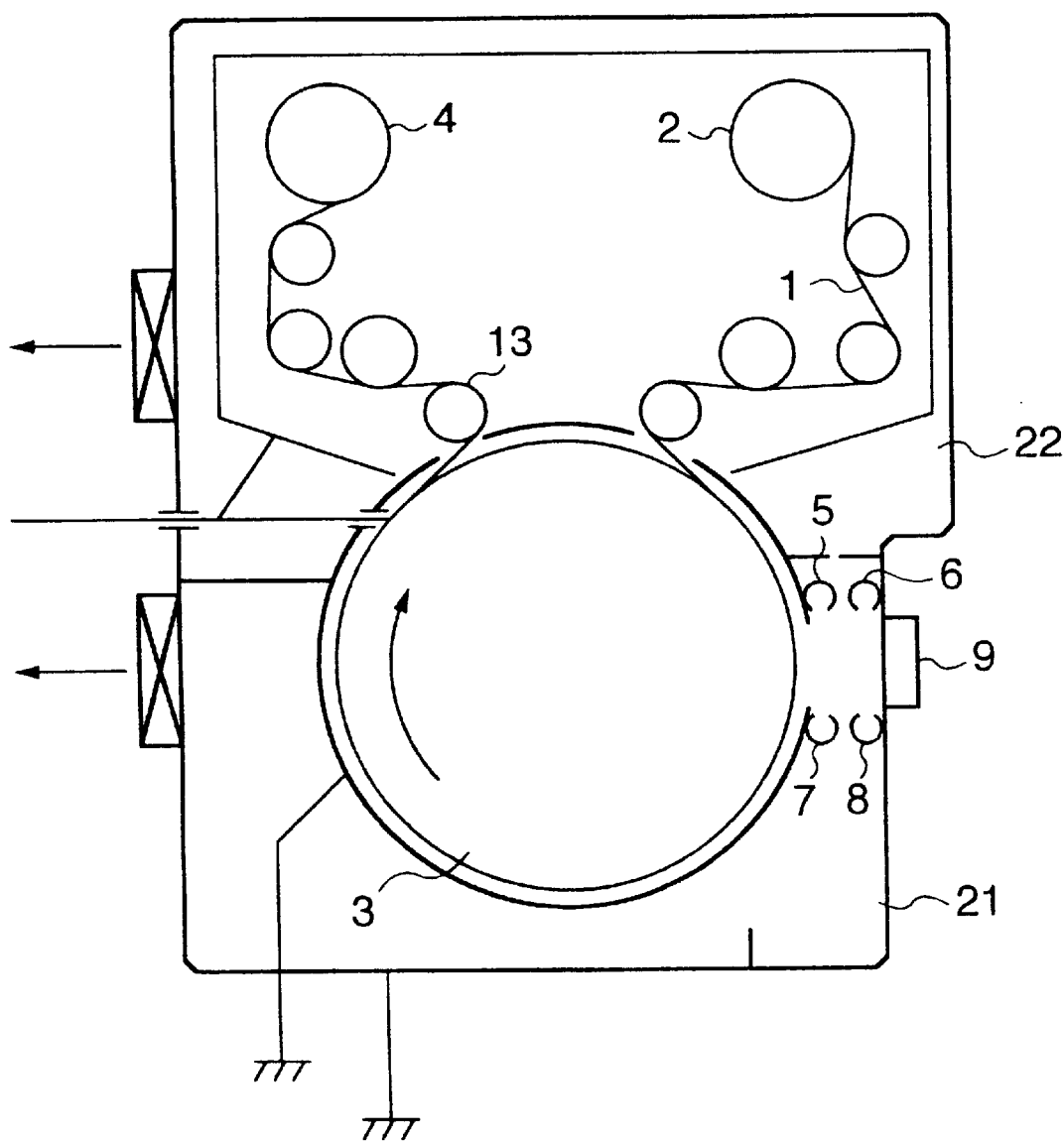
FIG. 12 is a schematic view of a continuous plasma CVD apparatus according to the fifth embodiment of the present invention.
Figure 13:
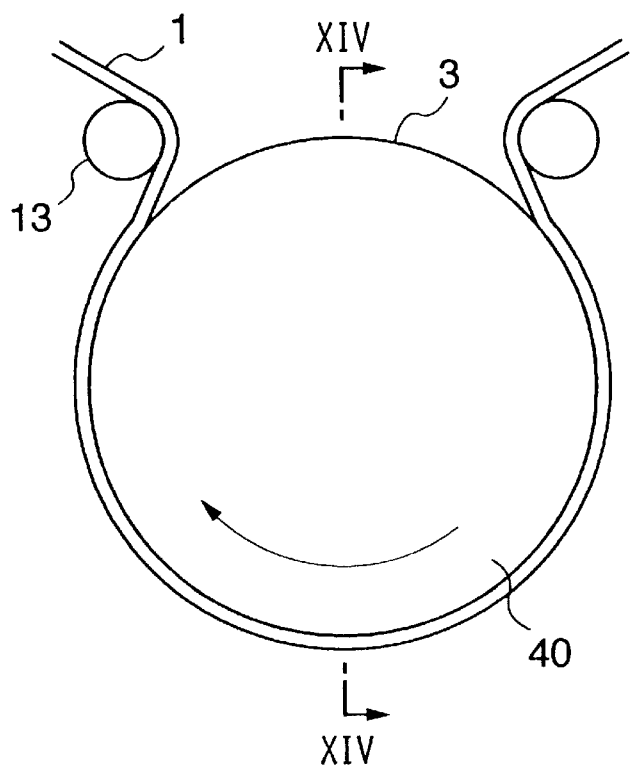
FIG. 13 is a side view of a rotating drum used in the plasma CVD apparatus of FIG. 12.
Figure 14:
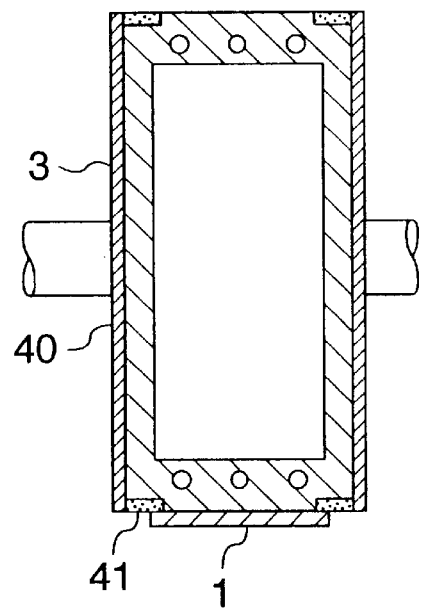
FIG. 14 is a schematic sectional view taken along line XIV—XIV of FIG. 13.
Figure 15:
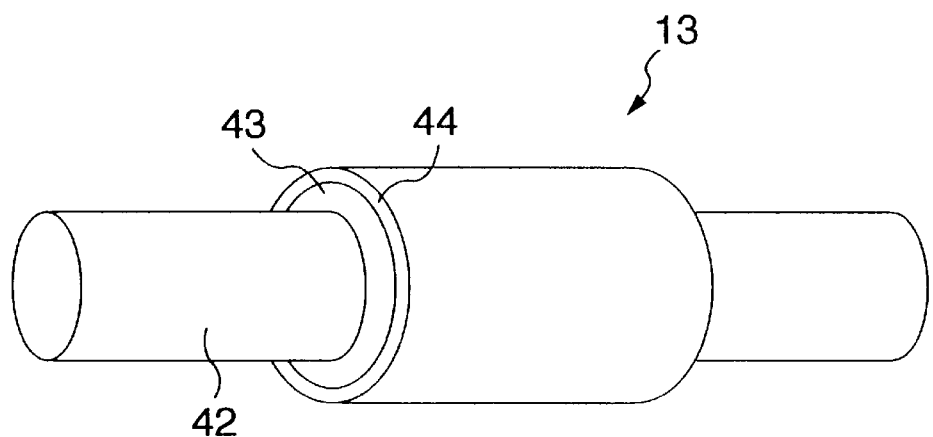
FIG. 15 is an oblique view of an intermediate roller used in the plasma CVD apparatus of FIG. 13.

FIG. 12 is a schematic view of a plasma CVD apparatus according to the fifth embodiment of the present invention, FIG. 13 is a side view of a rotating drum used in the plasma CVD apparatus, FIG. 14 is a schematic sectional view along line XIV—XIV of FIG. 13, and FIG. 15 is an oblique view of an intermediate roller used in the plasma CVD apparatus.

As shown in FIG. 12, a continuous and wide substrate 1 having electrical conductivity is continuously fed from unwind roller 2 electrically insulated from earth potential, and a film is formed thereon by passing the substrate on the peripheral surface of rotating drum 3 in cooled state at a given speed and is taken up in succession by wind roller 4 electrically insulated from the earth potential. Several intermediate rolls 13 are provided between the unwind roller 2 and the rotating drum 3 and between the rotating drum 3 and the wind roller 4.

A monomer gas comprising a hydrocarbon gas is fed from gas inlets 5 and 7 and a carrier gas is fed from gas inlets 6 and 8 at a given ratio. These gases are kept in plasma state by the microwave applied from microwave linear applicator 9 and a plasma CVD film is continuously formed on the outer surface of the carried substrate 1.

Although not shown in the drawing, a self-bias voltage is applied to rotating drum 3 by a high-frequency source through a matching box, and a wide and uniform plasma CVD film is continuously formed on the substrate 1. Moreover, DC voltage is applied to the rotating drum 3 by a DC source to provide a potential difference between the rotating drum 3 and the substrate 1. When the potential difference is provided only by the self-bias voltage, the DC source is not needed.

As shown in FIG. 14, the side wall of the rotating drum 3 is covered with a fluorocarbon resin film 40 such as of polytetrafluoroethylene (trademark: Teflon) and both ends of the film running face are covered with alumina plasma flame sprayed film 41. Fluorocarbon resin film 40 and alumina plasma flame sprayed film 41 are used here as insulating materials, but these are not limiting and any electrical insulation materials may be used with causing no problems. Furthermore, the film running face is covered at only both ends thereof in this embodiment, but the whole film running surface may be covered with causing no problems.

Furthermore, for maintaining a sufficient impedance between the substrate and the earth, the intermediate roller 13 is composed of roller core material 42 comprising an electrical insulation material mainly composed of a ceramics material such as alumina, glass, a polymeric material or a composite thereof, roller body 43 comprising stainless steel (SUS) or the like, and roller surface layer 44 covering the surface of the roller body 43 which comprises a hard Cr plating, a ceramics material, a hard glass, a carbon film, a boron film, a metal carbide film, a metal oxide film, a metal nitride film, or the like, as shown in FIG. 15.

Table 5 shows results of test on relation of construction of base film, construction of side wall of the rotating drum, construction of film running face, potential difference between the substrate and the rotating drum and damage of the substrate when a diamond-like carbon film of 10 nm thick was formed under the following conditions using a substrate comprising a base film and a Co—O film of 0.15 µm thick formed on the base film.

TABLE 5

| No. | Base film | Side wall of rotating drum | Film running face | Potential difference between substrate and rotating drum | Damage of substrate |
|---|---|---|---|---|---|
| 61 | Aramid film of 50 µm thick | SUS | SUS | 0 V | Occurred |
| 62 | Aramid film of 50 µm thick | Teflon | SUS | 5 V | Occurred |
| 63 | Aramid film of 50 µm thick | SUS | Alumina at both ends | 10 V | Occurred |
| 64 | Aramid film of 50 µm thick | Teflon | Alumina at both ends | 20 V | Not occurred |
| 65 | PET film of 10 µm thick | Teflon | Alumina at both ends | 40 V | Not occurred |
| 66 | PET film of 10 µm thick | Teflon | Alumina at both ends | 60 V | Not occurred |
| 67 | PET film of 10 µm thick | Teflon | Alumina at both ends | 400 V | Not occurred |
| 68 | PET film of 10 µm thick | Teflon | Alumina at both ends | 600 V | Not occurred |
| 69 | Aramid film 50 µm thick | Teflon | Alumina at both ends | 1000 V | Not occurred |
| 70 | Aramid film 50 µm thick | Teflon | Alumina at both ends | 1100 V | Occurred |

Frequency of microwave: 2.45 GHz

Input electric power: 3 kW

Introduced gas: Methane and argon (3:1)

Degree of vacuum in carrying chamber: $5\times10^{-5}$ Torr

Degree of vacuum of film forming chamber: 0.07 Torr

Test Results:

In the case of Sample No. 61, plasma entered around the side wall of the rotating drum and the both end portions of film running face and, hence, insulation between the substrate and the rotating drum could not be attained, and no potential difference was provided. Therefore, the substrate floated up and even the aramid film of high heat resistance was damaged.

In the case of Sample No. 62, plasma entered around both the end portions of film running face of the rotating drum and, hence, insulation between the substrate and the rotating drum could not be sufficiently attained and potential difference was insufficient. Therefore, the substrate floated up and even the aramid film of high heat resistance was damaged.

In the case of Sample No. 63, plasma entered around the side wall of the rotating drum and, hence, insulation between the substrate and the rotating drum could not be sufficiently attained and potential difference was insufficient. Therefore, the substrate floated up and even the aramid film of high heat resistance was damaged.

As in the case of Sample Nos. 64–69, when a Teflon film was formed on the side wall of the rotating drum and a plasma flame sprayed film of alumina was provided on both the end portions of the film running face, plasma did not enter around the side wall of the rotating drum and the both end portions of film running face and, hence, insulation between the substrate and the rotating drum could be sufficiently attained and furthermore, when a potential difference of 20–1000 V was present between the substrate and the rotating drum, the substrate was not damaged by heat.

In the case of Sample No. 70, although a sufficient potential difference was present between the substrate and the rotating drum, the potential difference was too large and exceeded dielectric breakdown strength to cause abnormal discharge, resulting in damage of the substrate.

Table 6 shows results of test conducted on the Sample No. 67 in Table 5 for the relation of material of roller core material of the intermediate roller (shaft material), material of roller body (roller material), material of the roller surface layer (roller surface), surface roughness of the roller, impedance between the roller surface and the earth and damages of the substrate.

In the case of Sample No. 71, since the whole of the intermediate roller was made of a metal, impedance between the roller and the earth was nearly 0, and high-frequency current flowed and Joule's heat generated thereby caused damage of the substrate.

In the case of Sample No. 72, since the impedance between the roller and the earth was small, namely, 800 Ω, high-frequency current also flowed and Joule's heat caused damage of the substrate.

In the case of Sample No. 73, the impedance between the roller and the earth was great, but since the surface of the roller was rough (surface roughness 0.3 S), the substrate was somewhat deformed and damaged.

In the case of Sample No. 74, the impedance between the roller and the earth was great, and the surface roughness of the roller was small, namely, 0.15 S, but hardness of the roller was low. Therefore, the surface smoothness was gradually damaged due to sliding with the substrate, and the substrate was slightly deformed and damaged.

In the case of Sample Nos. 75 and 76, the impedance between the roller and the earth was sufficiently great, and the surface smoothness and hardness of the roller were sufficient. Therefore, the substrate was not damaged.

As can be seen from Table 5 and Table 6, a thin film can be obtained which serves the purpose and is free from damage of the substrate at the film formation when there is present a potential difference between the rotating drum and the electrically conductive portion of the substrate, the average potential difference is 20–1000 V, preferably 40–600 V, the impedance between the surface of guide roller and the earth is 1 KΩ or more, the surface roughness of the guide roller is 0.2 S or less, and Vickers hardness is 500 or more.

Figure 16:
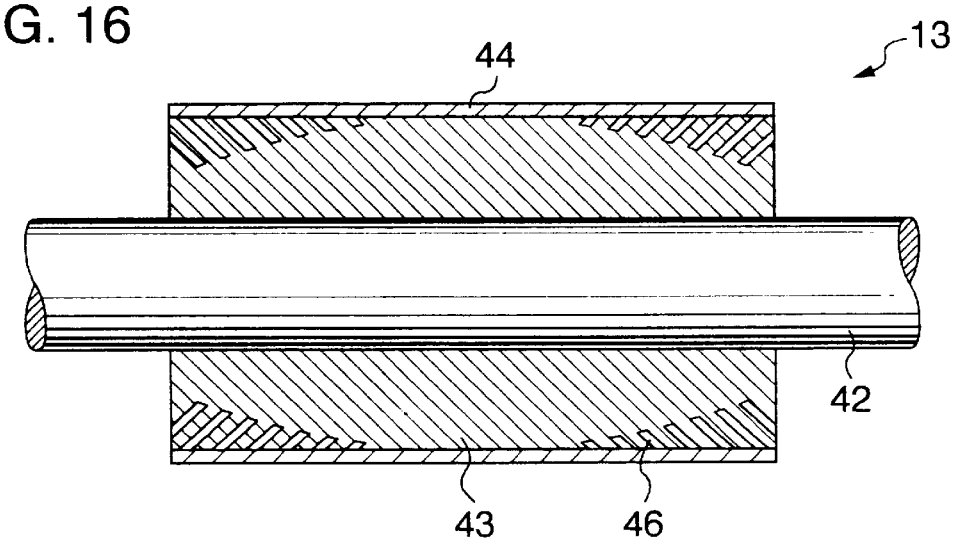
FIG. 16 is a sectional view of an intermediate roller according to the sixth embodiment of the present invention.
Figure 17:
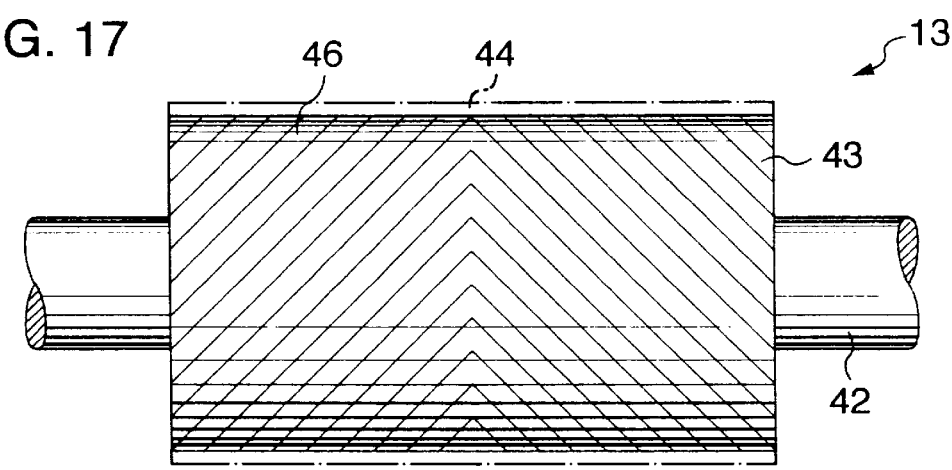
FIG. 17 is a plan view of the roller body of the intermediate roller of FIG. 16.

FIG. 16 is an enlarged sectional view of an intermediate roller according to the sixth embodiment of the present invention, and FIG. 17 is an enlarged plan view of roller body of the intermediate roller. Roller core material 42 of the intermediate roller 13 according to this embodiment comprises a hard material such as alumina or SUS, and the roller body 43 comprises a relatively elastic electrical insulation material, such as rubber or flexible synthetic resin.

As shown in FIG. 17, on the peripheral surface of roller body 43, many grooves 46 inclined in the form of chevron are formed in parallel so that they spread out from the center part of the roller body 43 towards end portions of both sides, and as shown in FIG. 16, bottom of these inclined grooves 46 inclines towards the center part of the roller body 43 and furthermore the grooves of the end portions of both sides are gradually deeper than the inclined grooves 46 of the center part.

On the peripheral surface of the roller body 43 is clad a roller surface layer 44 comprising a flexible and relatively

TABLE 6

| No. | Material of shaft | Material of roller | Surface of roller | Surface hardness of roller | Surface property of roller | Impedance between roller surface and earth | Damage of substrate |
|---|---|---|---|---|---|---|---|
| 71 | SUS | SUS | Cr plating | 500 | 0.2S | 0 Ω | Occurred |
| 72 | Alumina | SUS | Cr plating | 500 | 0.2S | 800 Ω | Occurred |
| 73 | Alumina | Alumina | Cr plating | 500 | 0.3S | 1200 Ω | Occurred |
| 74 | Alumina | SUS | SUS | 180 | 0.2S | 1200 Ω | Occurred |
| 75 | Alumina | SUS | Cr plating | 500 | 0.2S | 1000 Ω | Not occurred |
| 76 | Alumina | SUS | Cr plating | 700 | 0.15S | 1200 Ω | Not occurred |
| 77 | Alumina | SUS | Cr plating | 700 | 0.15S | 400 Ω | Not occurred | thin rubber or synthetic resin which does not damage the function of the inclined grooves 46 referred to hereinafter. In this embodiment, the roller surface layer 44 is used, but this is not necessarily required.

Figure 18:
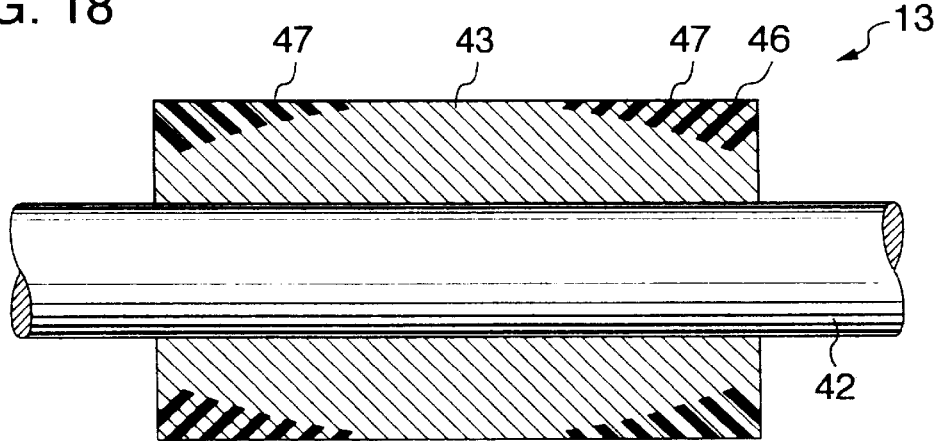
FIG. 18 is a sectional view of an intermediate roller according to the seventh embodiment of the present invention.

FIG. 18 is an enlarged sectional view of an intermediate roller according to the seventh embodiment of the present invention. In the case of intermediate roller 13 according to this embodiment, roller body 43 comprises a relatively hard electrical insulation material such as a hard rubber or a hard synthetic resin, and many inclined grooves 46 are formed as in the sixth embodiment, and these grooves are filled with soft material 47 comprising soft rubber or the like.

Figure 19:
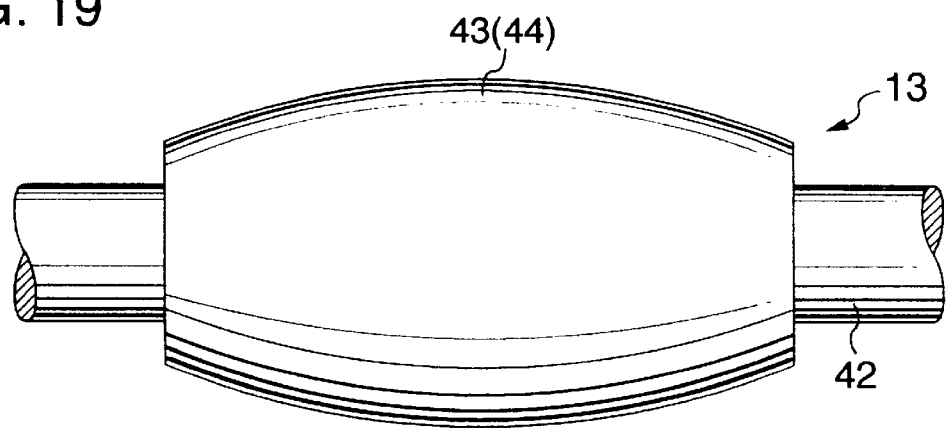
FIG. 19 is a plan view of an intermediate roller according to the eighth embodiment of the present invention.

FIG. 19 is an enlarged side view of an intermediate roller according to the eighth embodiment of the present invention. In this intermediate roller 13, diameter of the roller gradually decreases from center part toward both end sides. That is, this roller is swollen in the center part (crown roller).

Figure 20:
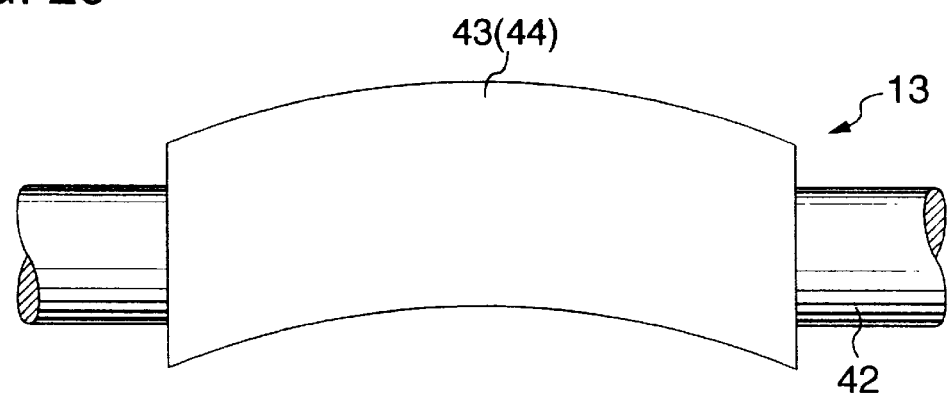
FIG. 20 is a plan view of an intermediate roller according to the ninth embodiment of the present invention.

FIG. 20 is an enlarged side view of an intermediate roller according to the ninth embodiment of the present invention. This intermediate roller 13 is curved from the center part toward both end sides in the form of a banana.

By using the intermediate rollers 13 according to the sixth to ninth embodiments explained above in the carrying system of substrate 1, substrate 1 does not slip out of the center of the carrying route even at high-speed carrying of substrate 1 and furthermore an adequate tension is applied in the width direction of substrate 1 to be able to effectively prevent formation of wrinkles.

Figure 21:
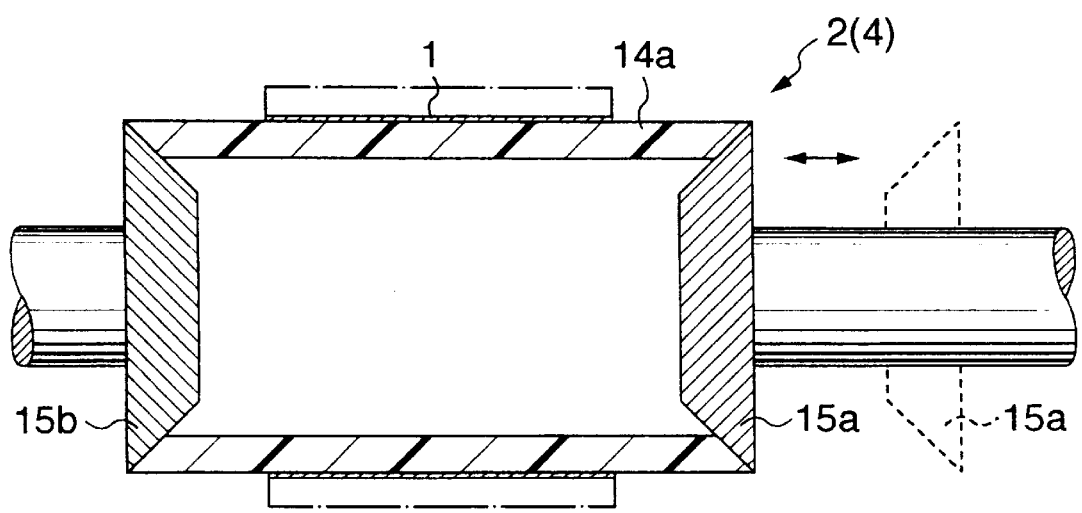
FIG. 21 is a sectional view of an unwind roller (a wind roller) according to the tenth embodiment of the present invention.
Figure 22:
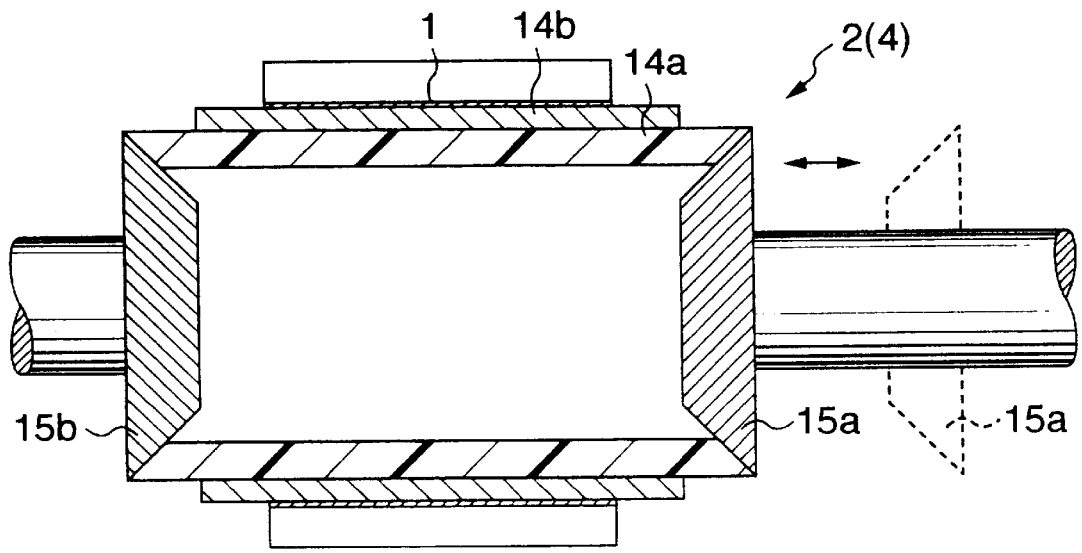
FIG. 22 is a sectional view of an unwind roller (a wind roller) according to the eleventh embodiment of the present invention.

FIG. 21 and FIG. 22 are enlarged sectional views of a unwind roller and/or wind roller according to the tenth and eleventh embodiments of the present invention. In the case of the tenth embodiment shown in FIG. 21, unwind roller 2 and/or wind roller 4 are mainly composed of cylindrical insulation core 14a and ceramic taper cones 15a and 15b which support the both ends of the insulation core 14a. One or both of the taper cones 15 (one in this embodiment) can move back to the position shown by a dotted line, whereby exchange of insulation core 14a becomes easy. As shown in FIG. 21, both the ends of the insulation core 14a is tapered at the same angle as the taper cones 15a, 15b, whereby the insulation core 14a can be stably supported.

In the case of the eleventh embodiment shown in FIG. 22, on the outer periphery of the insulation core 14a is integrally provided a cylindrical metal core 14b which is shorter in the length in axial direction than the insulation core 14a, and the surface of the metal core 14b which contacts with substrate 1 is subjected to mirror finish and secures a high surface smoothness. Other construction is the same as in the tenth embodiment.

Figure 23:
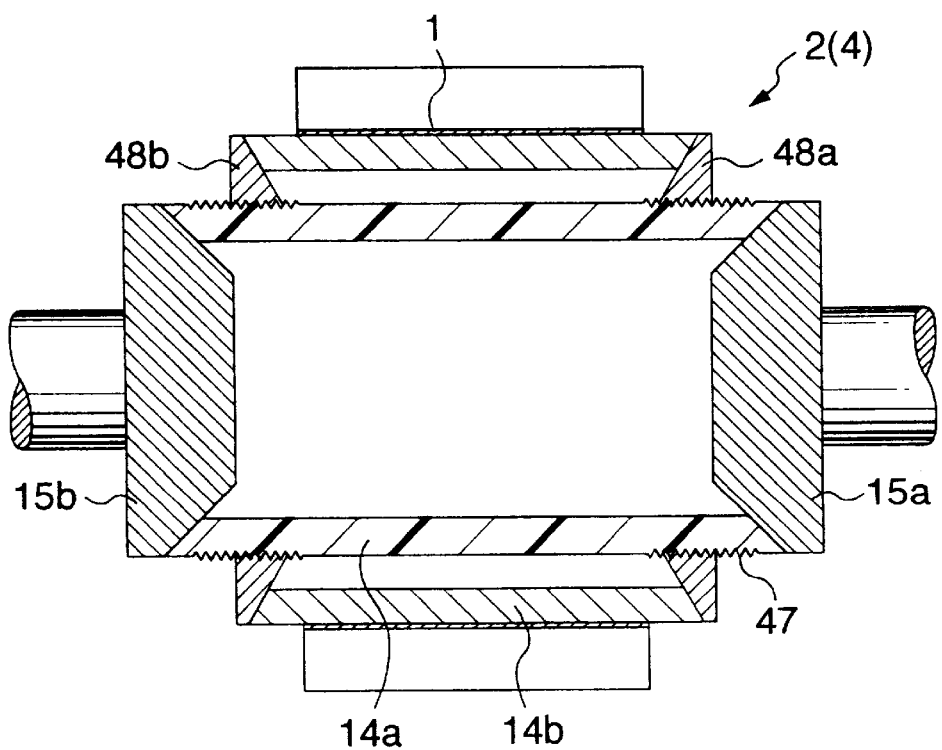
FIG. 23 is a sectional view of an unwind roller (a wind roller) according to the twelfth embodiment of the present invention.

FIG. 23 is an enlarged sectional view of a unwind roller and/or wind roller according to the twelfth embodiment of the present invention. In the case of this embodiment, screw 47 is formed on the peripheral face in the vicinity of both end portions of insulation core 14a, and two core fixing rings 48a and 48b are fitted to the screw 47. The opposite sides of the core fixing rings 48a and 48b are provided with scarfed areas, and a metal core 14b is allowed to intervene between the core fixing rings 48a and 48b and is fixed by turning the core fixing rings 48a and 48b.

As aforementioned, when the film formation is carried out for a long time using plasma CVD apparatus, a large amount of plasma CVD film is also formed on the parts other than the substrate around it. This film is very brittle and peels off during the film formation, and a part of it deposits on the substrate and others to cause various disadvantages such as contamination. For example, if the substrate having such deposit is taken up as it is, the substrate comprising a flexible film which is taken up and wound on the deposit of the peeled film is deformed as shown in FIG. 24.

Figure 24:
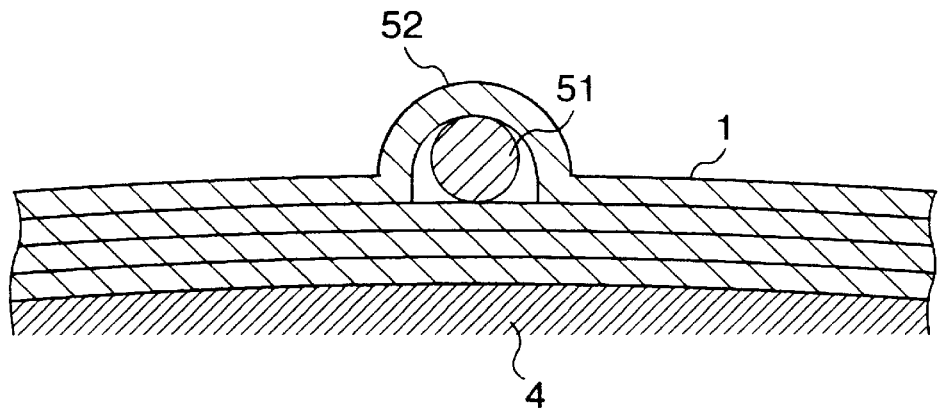
FIG. 24 is an enlarged sectional view which shows the state of the deposit sticking to the substrate.

In FIG. 24, 1 indicates a substrate comprising a flexible film or the like, 4 indicates a wind roller, 51 indicates the deposit, and 52 indicates the portion of substrate 1 deformed by the deposit 51.

In case that the film is a functional thin film such as a magnetic recording medium or a solar battery, the reliability of the function deteriorates. Furthermore, if the films having the deposit are marketed as they are, and used as wrapping films for foods, the wrapped food is contaminated with the deposit.

As a result of extensive research conducted by the inventors, it has been found that the contamination of the substrate is caused by the deposition of plasma CVD film which is formed on the portions other than the substrate, increases in its thickness to more than a certain degree and peels off due to internal stress. In order to solve this problem, it is necessary to diminish the film formation on the portions other than the substrate or, even if the film is deposited on the portions other than the substrate, to prevent the film from sticking to the substrate.

Based on the investigation, according to this embodiment, deposition of dusts on the surface of the substrate is prevented by flowing an introduction gas such as a raw material gas or inactive gas along the surface of the substrate.

Figure 25:
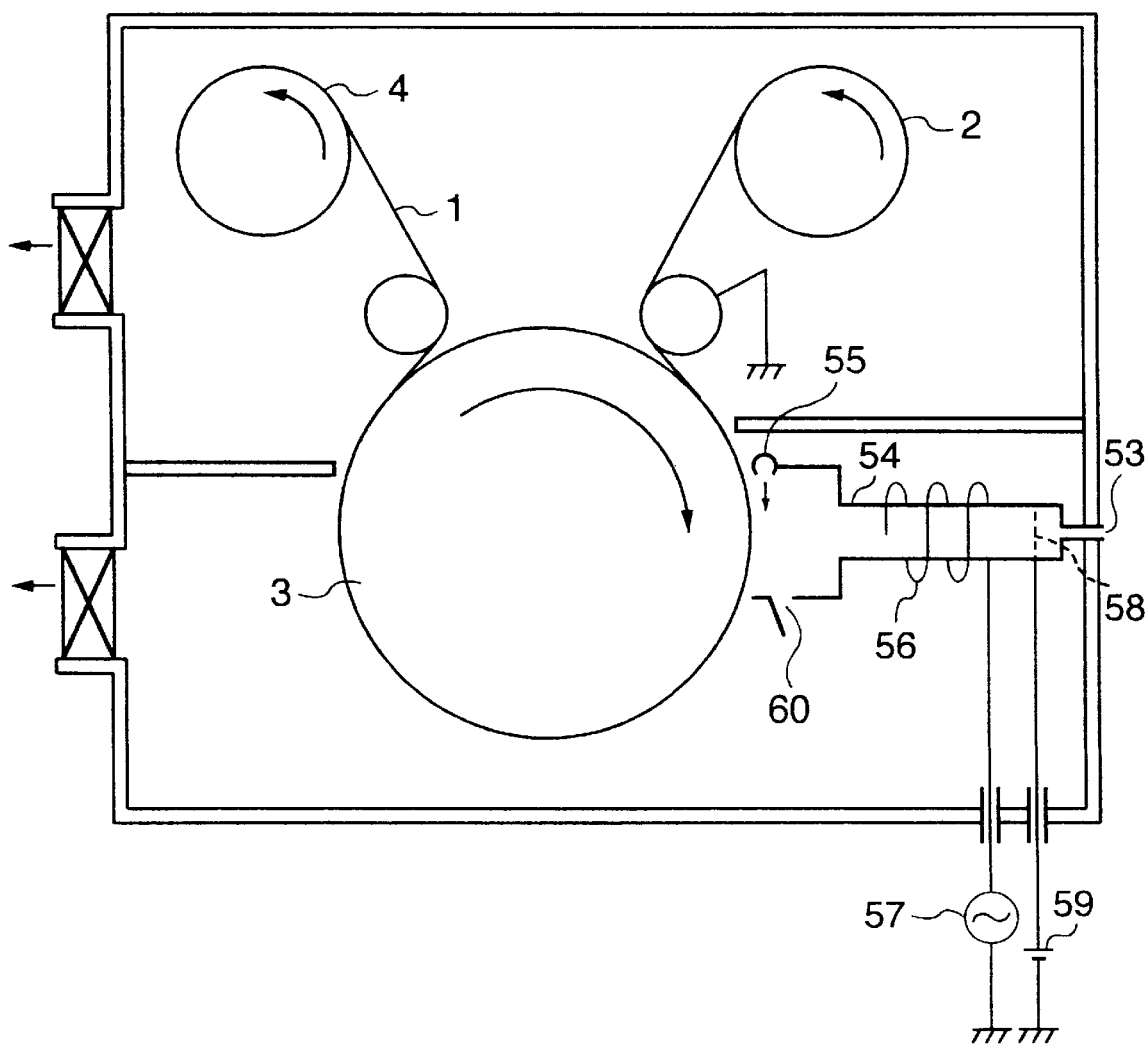
FIG. 25 is a schematic view of a plasma CVD apparatus according to the thirteenth embodiment of the present invention.

FIG. 25 is a schematic view of a plasma CVD apparatus according to the thirteenth embodiment of the present invention. The film substrate 1 comprising a PET film of 6 μm thick and a Co—O film of 0.15 μm thick obliquely vapor deposited on the PET film is taken up by wind roller 4 from unwind roller 2 through rotating drum 3. A mixed gas comprising 10 vol % of methane and 90 vol % of hydrogen in an amount of 140 sccm is introduced into plasma tube 54 from gas inlet 53, and a 100% methane gas in an amount of 40 sccm is blown from gas inlet 55 provided near the peripheral surface of rotating drum 3 so that the gas flows along the surface of the substrate 1, thereby to carry out film formation and cleaning of the substrate surface. The excess gas which has not participated in the reaction is discharged out of the apparatus from gas outlet 60 provided at the position opposing the gas inlet 55.

A high-frequency of 13.56 MHz and 800 W is applied to high-frequency coil 56 wound around plasma tube 54 from high-frequency source 57, whereby said introduction gas is kept in plasma state. A bias is given by applying a voltage of +3000 V to accelerating electrode 58 from constant-voltage source 59 and a diamond-like carbon film is formed on the substrate 1.

Such embodiment which carries out cleaning of the substrate surface with an introduction gas can be applied also to the plasma CVD apparatuses shown, for example, in FIG. 1 and FIG. 12. In the plasma CVD apparatus of FIG. 1, 120 sccm of a mixed gas comprising 30 vol % of hexamethyldisiloxane and 70 vol % of oxygen is blown from gas inlets 5 and 7 so that the gas flows along the surface of substrate 1 (a polyester film of 10 μm thick), and 60 sccm of a 100% helium gas is blown against the substrate 1 from gas inlets 6 and 8.

These gases are kept in plasma state by microwave of 2.45 GHz and 1500 W applied from microwave linear applicator 9. A self-bias of 300 V is applied to the rotating drum 3 from high-frequency source 10 to form an SiOx film (x=1.7) on the substrate 1.

Table 7 shows results of still endurance test on the magnetic recording medium having a diamond-like carbon film prepared in accordance with FIG. 25 [Example (1)] and a magnetic recording medium having a diamond-like carbon film [Comparative Example (1)] prepared in the same manner as in Example (1) except that 170 sccm of a mixed gas comprising 30 vol % of methane and 70 vol % of hydrogen was introduced into plasma tube 54 from gas inlet 53 and blowing of gas from gas inlet 55 was not carried out.

TABLE 7

| Sample No. | 81 | 82 | 83 | 84 | 85 | 86 | 87 | 88 | 89 | 90 |
|---|---|---|---|---|---|---|---|---|---|---|
| | | | | | | | | | [Unit: minute] | |
| Example (1) | >60 | >60 | >60 | >60 | >60 | >60 | >60 | >60 | >60 | >60 |
| Comparative Example (1) | >60 | 34 | 13 | >60 | >60 | 32 | >60 | 8 | >60 | 27 |

These magnetic recording media are magnetic tapes for digital VTR, and 10 tapes each were prepared (Sample Nos. 81–90). All of them were subjected to still endurance test. As a result of the test, it was found that the magnetic tapes of this embodiment had all a still endurance of higher than 60 minutes while the still endurance of the magnetic tapes of Comparative Example (1) varied widely due to deposition of dusts.

Using films having $SiO_x$ film prepared in accordance with FIG. 1 [Example (2)] and films of Comparative Example (2), 10000 bags of 30 cm×30 cm were prepared, respectively, and state of incorporation of dusts into the bags was examined. The results are shown in Table 8. The film of Comparative Example (2) was prepared by forming $SiO_x$ (x=1.7) film on a polyester film in the same manner as in Example (2), except that in FIG. 1, blowing of gas from gas inlets 5 and 7 was not carried out and 1800 sccm of a mixed gas comprising 25 vol % of hexamethyldisiloxane, 50 vol % of oxygen and 25 vol % of helium was blown against substrate 1 from gas inlets 6 and 8. As can be seen from the results of this test, incorporation of dusts into the bags according to this embodiment was conspicuously smaller than in Comparative Example (2).

TABLE 8

| Incorporation of dusts | Incorporated | Not incorporated |
|---|---|---|
| Example (2) | 13 bags | 9987 bags |
| Comparative Example (2) | 3211 bags | 6789 bags |

Figure 26:
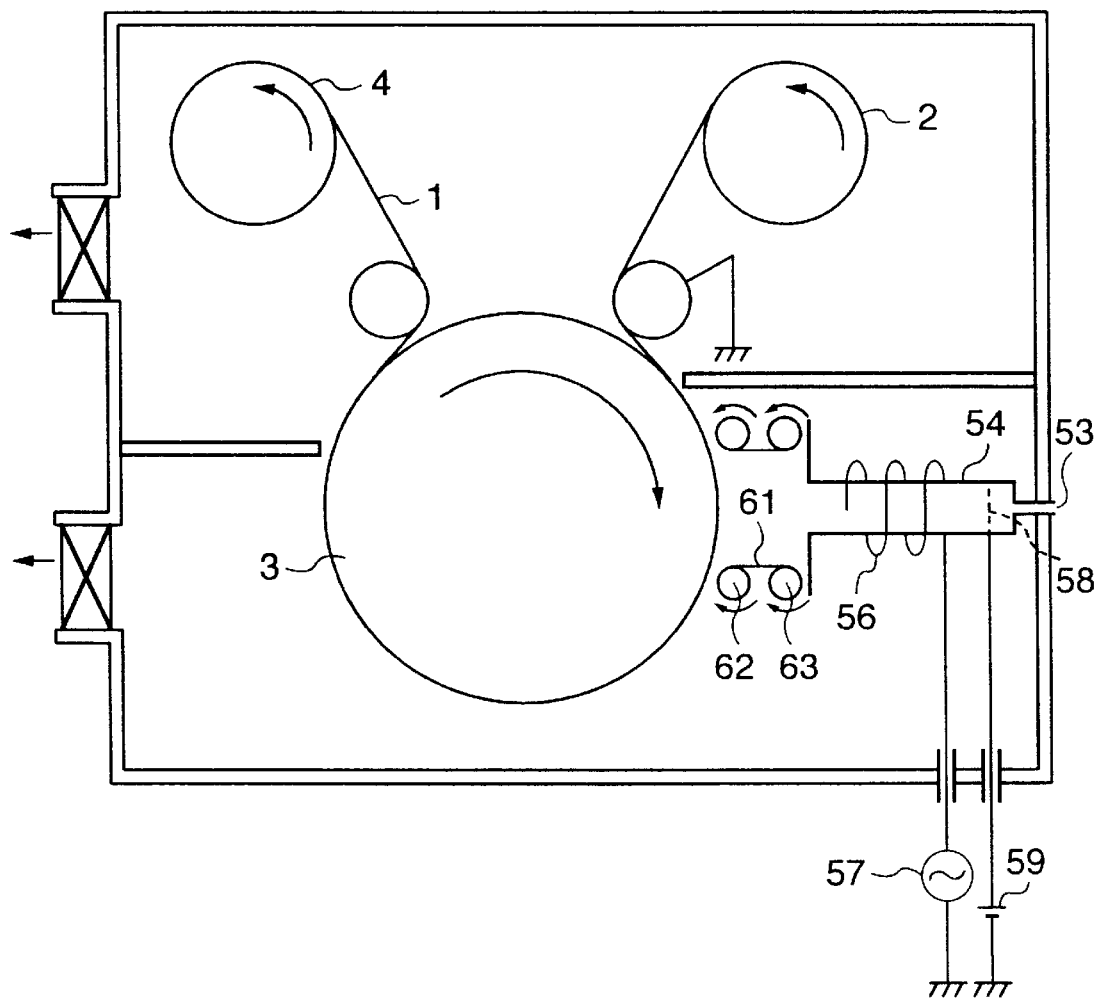
FIG. 26 is a schematic view of a plasma CVD apparatus according to the fourteenth embodiment of the present invention.

FIG. 26 is a schematic view of a plasma CVD apparatus according to the fourteenth embodiment of the present invention. In the case of this embodiment, a flexible base film 61 comprising, for example, a polyethylene terephthalate film of 30 μm thick, unwind roller 62 feeding the film and wind roller 63 taking up the film are arranged on both sides of the opening of plasma tube 54 on the side of rotating drum 3, and a part of the base film 61 is exposed between the unwind roller 62 and the wind roller 63.

At the time of film formation, the plasma CVD film is deposited also on the exposed surface of the base film 61, but before the film has the thick- ness at which peeling off occurs, namely, when a given time has elapsed after the film formation, the base film 61 is automatically taken up by the wind roller 63 and thus generation of dusts is inhibited.

Figure 27:
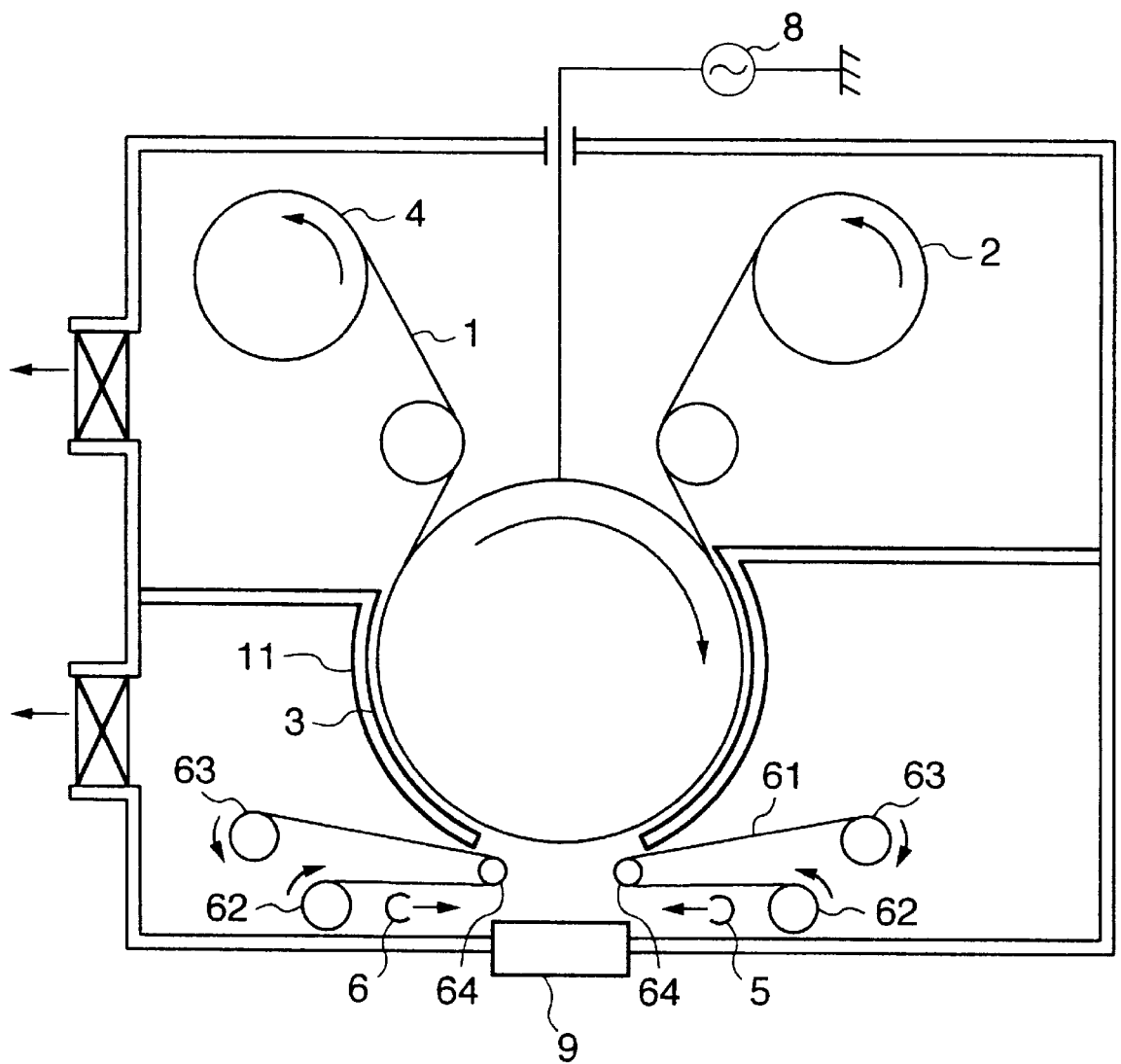
FIG. 27 is a schematic view of a plasma CVD apparatus according to the fifteenth embodiment of the present invention.
Figure 28:
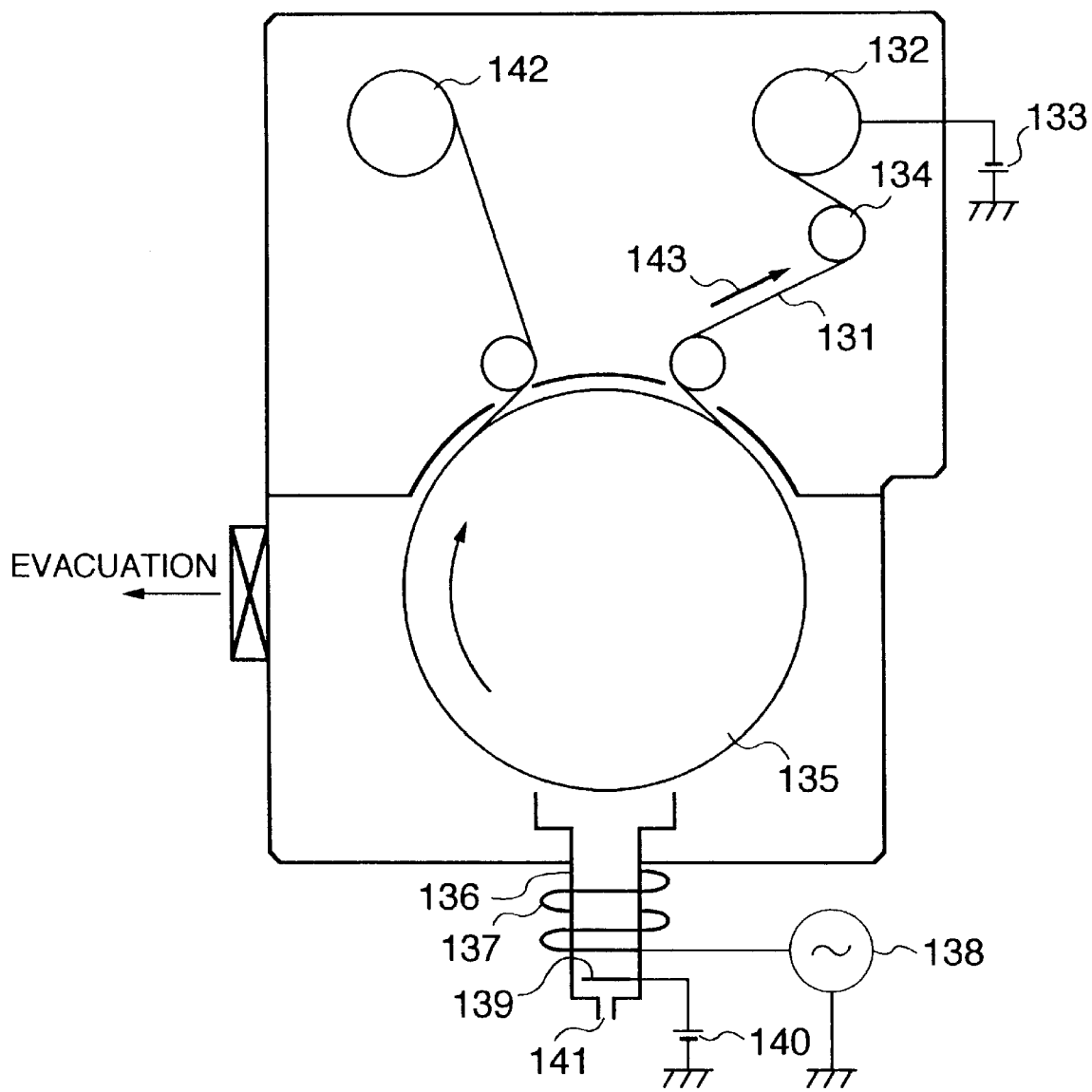
FIG. 28 is a schematic view of a conventional plasma CVD apparatus.
Figure 29:
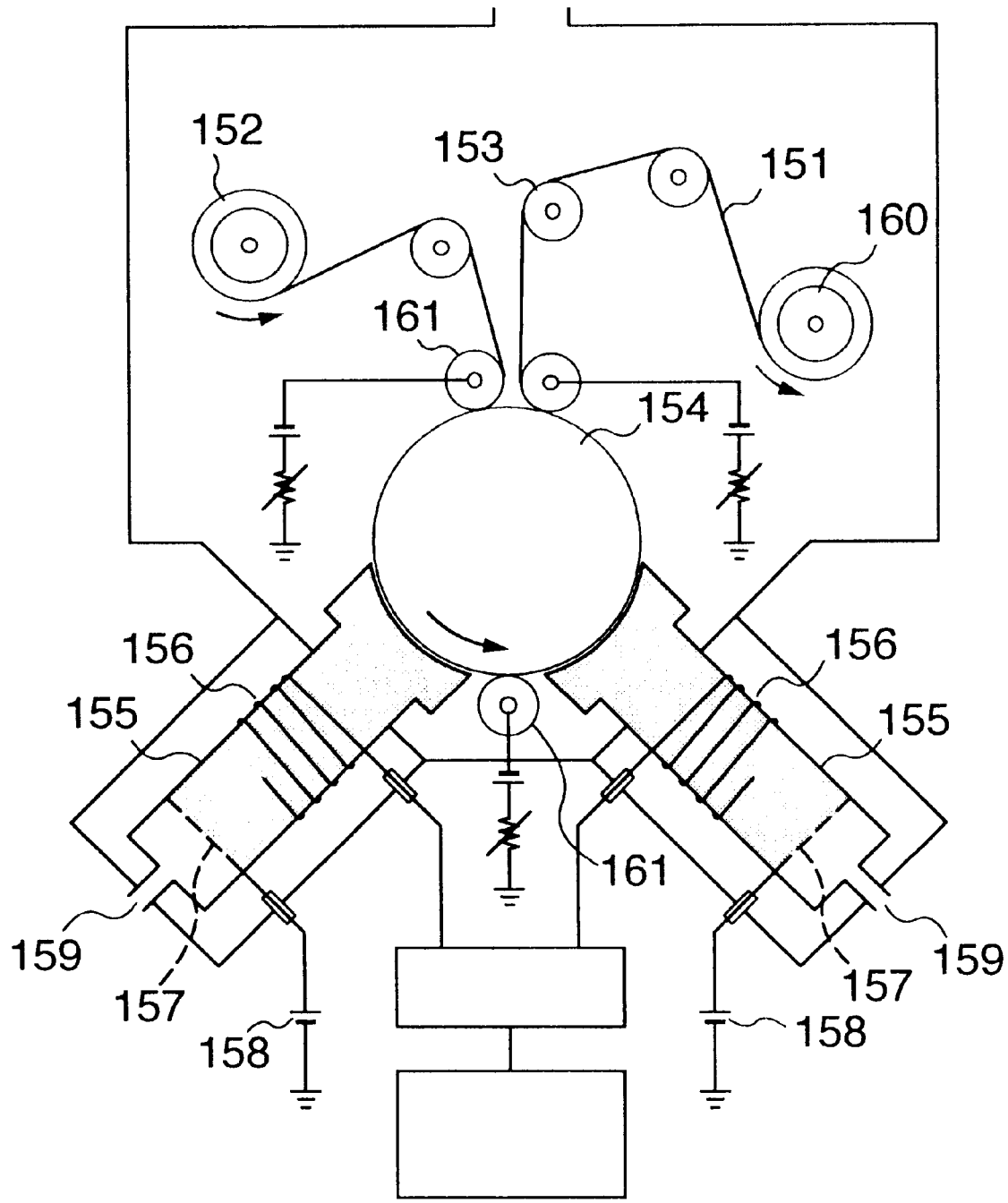
FIG. 29 is a schematic view of another conventional plasma CVD apparatus.
Figure 30:
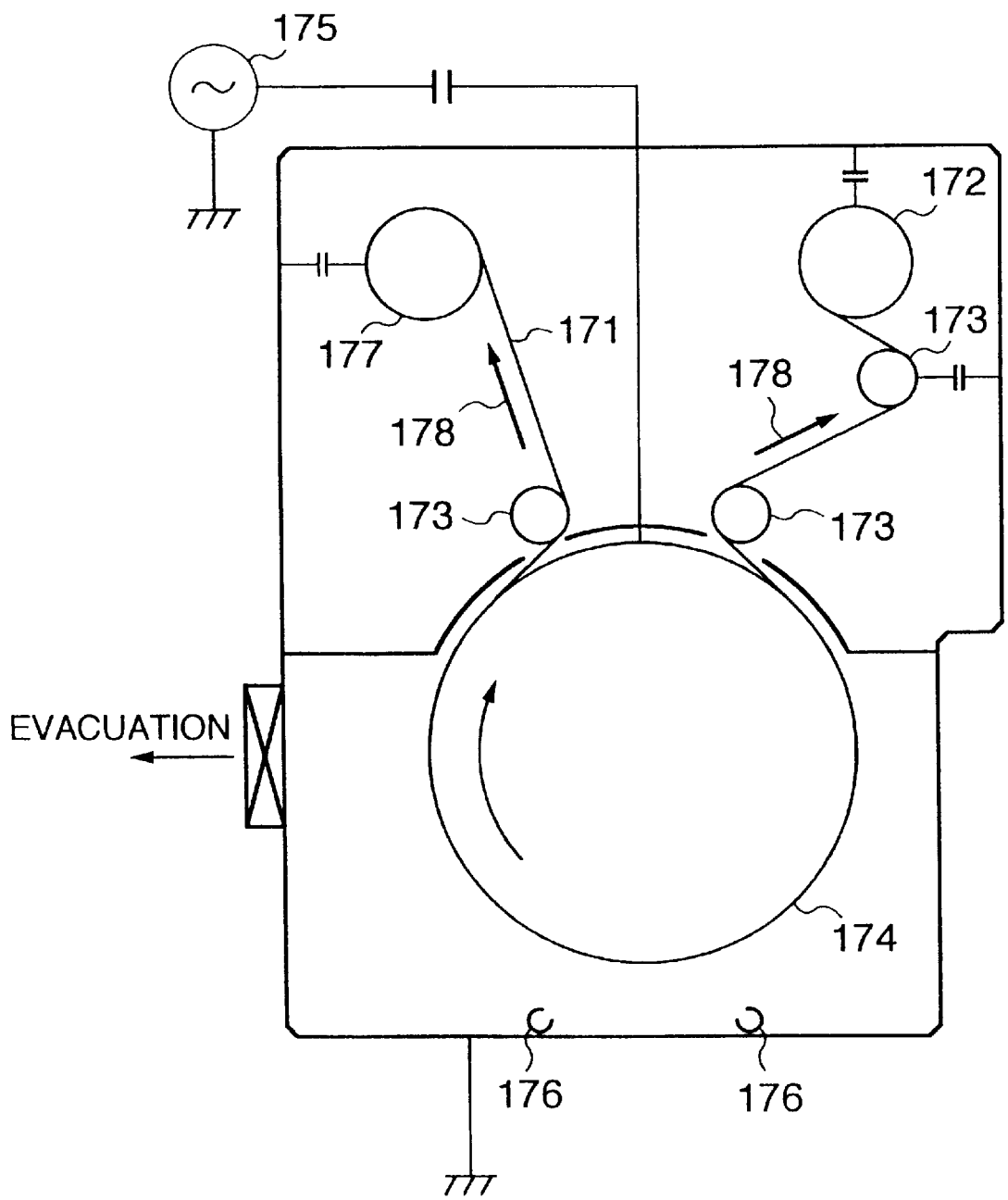
FIG. 30 is a schematic view of still another conventional plasma CVD apparatus.

FIG. 27 is a schematic view of a plasma CVD apparatus according to the fifteenth embodiment of the present invention. In the case of this embodiment, intermediate roller 64 is provided between unwind roller 62 and wind roller 63 and near rotating drum 3, and base film 61 fed from the unwind roller 62 is automatically taken up by the wind roller 63 through the intermediate roller 64 before the film has a thickness at which peeling off of the film occurs, whereby generation of dusts is inhibited.

Using films having SiOX film prepared in accordance with FIG. 27 [Example (3)] and films of Comparative Example (3), 10000 bags of 30 cm×30 cm were prepared, respectively, and incorporation of dusts into the bags was examined. The results are shown in Table 9. The film of Comparative Example (3) was prepared by forming $SiO_x$ (x=1.7) film on the substrate 1 in the same manner as in Example (3), except that in FIG. 27, the base film 61, the unwind roller 62, the wind roller 63 and intermediate roller 64 were not provided. As can be seen from the results of this test, incorporation of dusts into the bags according to this embodiment was conspicuously smaller than in Comparative Example.

TABLE 9

| Incorporation of dusts | Incorporated | Not incorporated |
|---|---|---|
| Example (3) | 6 bags | 9994 bags |
| Comparative Example (3) | 3211 bags | 6789 bags |

The embodiment explained above is of a magnetic recording medium having a ferromagnetic metal film, but the present invention is not limited thereto. For example, the present invention can also be applied to the formation of various functional films such as Mn—Zn ferrite film and $SiO_2$ film on substrates. In the above embodiment, the high-frequency voltage is applied to the substrate through a rotating drum, but the high-frequency voltage can also be applied directly to the substrate.

What is claimed is:

1. A plasma CVD apparatus which continuously forms a film by plasma on a surface of a substrate having electric conductivity and moving on a rotating drum by a roller system wherein a total of impedances between earth potential and roller surface of all rollers provided in a route of from a substrate unwind roller to a rotating drum is 10 kΩ or more and a total of impedances between earth potential and roller surface of all rollers provided in a route of from the rotating drum to a wind roller is 10 kΩ or more, and a blocking condenser is provided between the substrate and a high-frequency source applying a high frequency to the substrate.

2. A plasma CVD apparatus according to claim 1, wherein frequency of the high-frequency source is 50–900 KHz.

3. A plasma CVD apparatus according to claim 1 or 2, wherein the product C·f of electrostatic capacity C of the blocking condenser and frequency f of the high-frequency source is 0.02 [F·Hz] or more.

4. A plasma CVD apparatus according to claim 1 or 2, wherein a main exciting source which excites the plasma is a microwave.

5. A plasma CVD apparatus according to claim 1 or 2, wherein a carrying system for the substrate is provided with an unwind roller, a wind roller and an intermediate roller provided between the unwind roller and the wind roller, and main body of these rollers is made of electrical insulation materials.

6. A plasma CVD apparatus according to claim 1 or 2, wherein a carrying system for the substrate is provided with an unwind roller, a wind roller and an intermediate roller provided between the unwind roller and the wind roller, and main body of core material of at least one of these rollers is made of an electrical insulation material.

7. A plasma CVD apparatus according to claim 1 or 2, wherein a carrying system for the substrate is provided with an unwind roller, a wind roller and an intermediate roller provided between the unwind roller and the wind roller, and at least one of these rollers comprises a hollow body with no electrical insulation core material.

* * * * *